United States Patent [19]
Kaida et al.

[11] Patent Number: 5,585,701
[45] Date of Patent: Dec. 17, 1996

[54] CURRENT MIRROR CIRCUIT CONSTITUTED BY FET (FIELD EFFECT TRANSISTOR) AND CONTROL SYSTEM USING THE SAME

[75] Inventors: Katsuhiko Kaida; Hidemichi Kiuchi; Tetsuji Sakurai, all of Tokyo, Japan

[73] Assignee: Kabushiki Kaisha Toshiba, Kawasaki, Japan

[21] Appl. No.: 351,131

[22] Filed: Nov. 30, 1994

[30]     Foreign Application Priority Data

Nov. 30, 1993  [JP]  Japan ................................. 5-299949

[51] Int. Cl.⁶ .................................................... H02P 6/02
[52] U.S. Cl. .................................... 318/254; 318/439
[58] Field of Search ................................ 318/254, 439

[56]            References Cited

U.S. PATENT DOCUMENTS

| | | | |
|---|---|---|---|
| 4,491,772 | 1/1985 | Bitting | 318/254 |
| 4,827,207 | 5/1989 | Chieli | 323/316 |
| 4,967,309 | 10/1990 | Hoffman | 318/432 X |
| 4,977,356 | 12/1990 | Otani et al. | 318/138 |
| 5,103,148 | 4/1992 | Berringer et al. | 318/432 |
| 5,210,475 | 5/1993 | Juzswik et al. | 318/293 |
| 5,216,349 | 6/1993 | Kanouda et al. | 318/805 |
| 5,245,261 | 8/1993 | Ashley et al. | 318/558 |
| 5,436,545 | 7/1995 | Bahr et al. | 318/727 |

FOREIGN PATENT DOCUMENTS 60-112115  7/1985  Japan.
63-117682  5/1988  Japan.

*Primary Examiner*—David S. Martin
*Attorney, Agent, or Firm*—Oblon, Spivak, McClelland, Maier & Neustadt, P.C.

[57]           ABSTRACT

A circuit for generating a mirror current is provided, separately from a circuit for supplying a drive current. The mirror current generating circuit generates a mirror current of a predetermined ratio to the generated drive current. A circuit for detecting a current detects the mirror current. On the basis of the detected mirror current, the operation of a predetermined FET is controlled, and the amount of the drive current to be supplied to a motor is controlled. Thus, a decrease in the drive current due to a current source-side voltage loss can be prevented. In addition, power consumption due to current detection can be reduced, and as a result the drive current can be supplied efficiently.

40 Claims, 10 Drawing Sheets

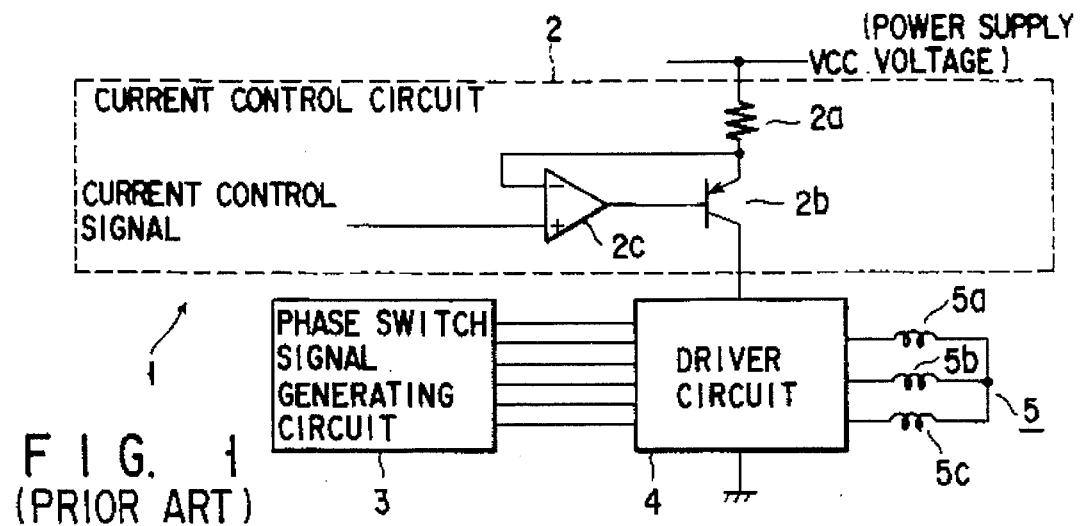
FIG. 1
(PRIOR ART)
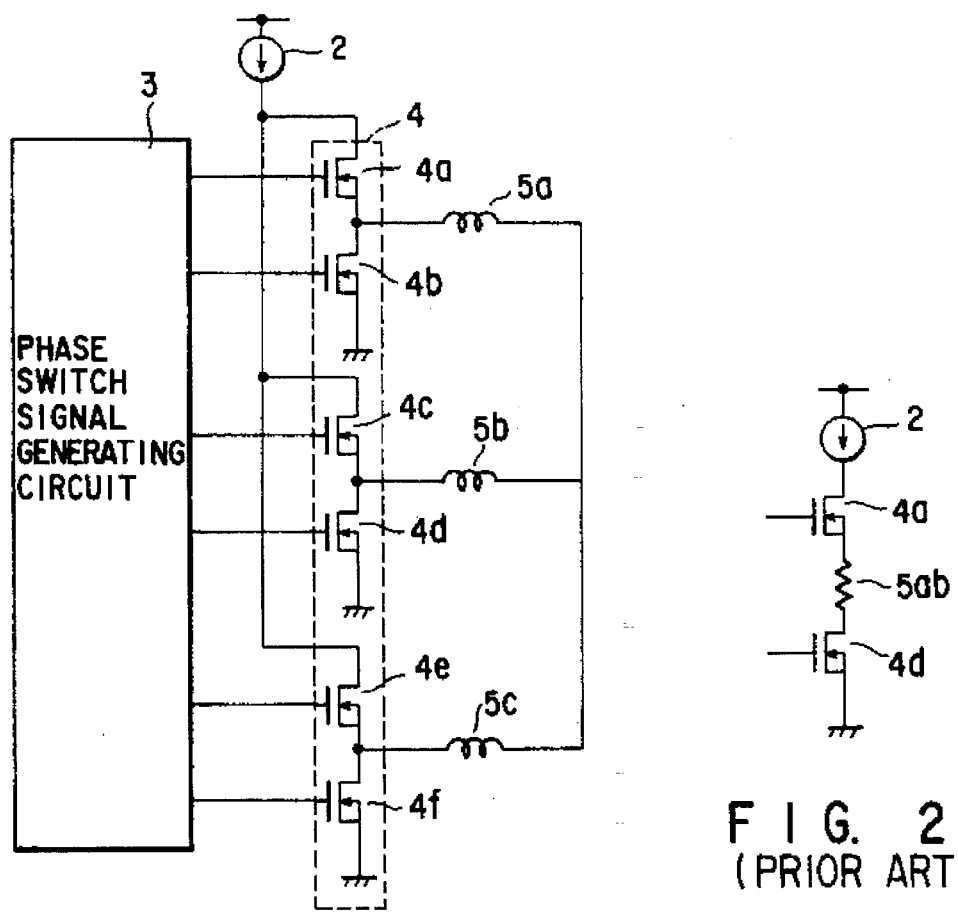
FIG. 2A
(PRIOR ART)
FIG. 2B
(PRIOR ART)

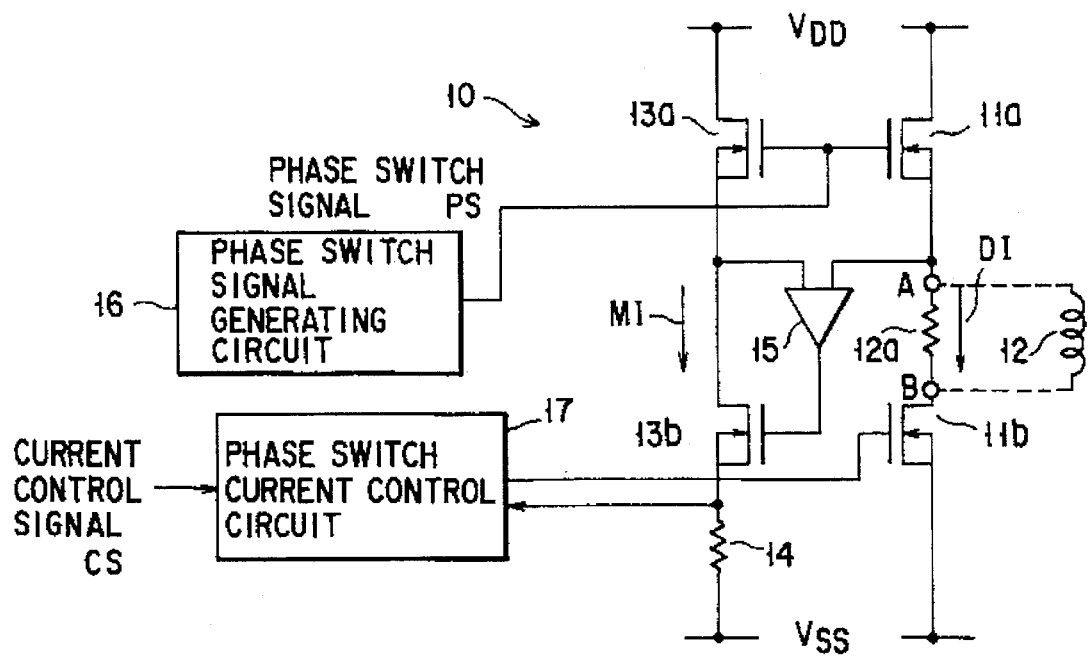
F I G. 3A
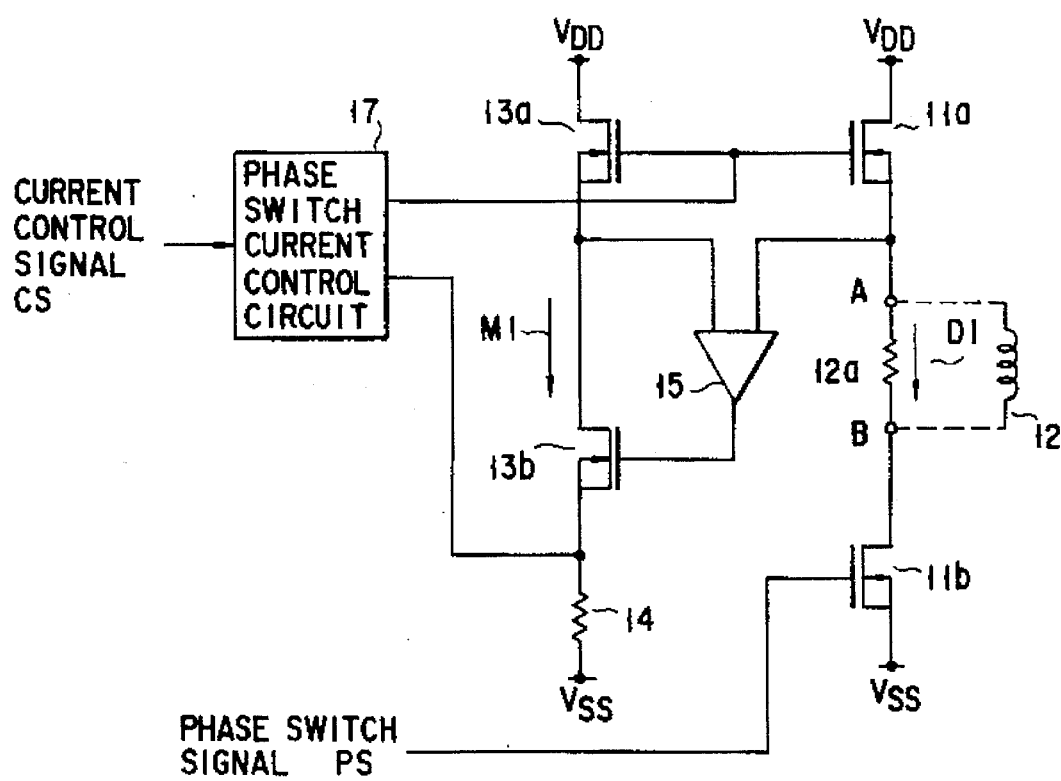
F I G. 3B

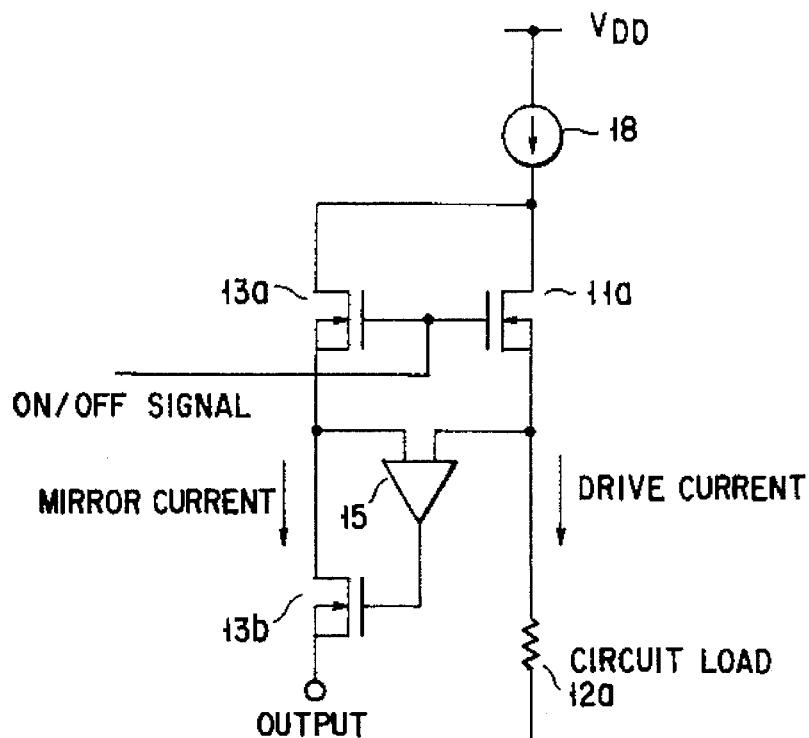
F I G. 5
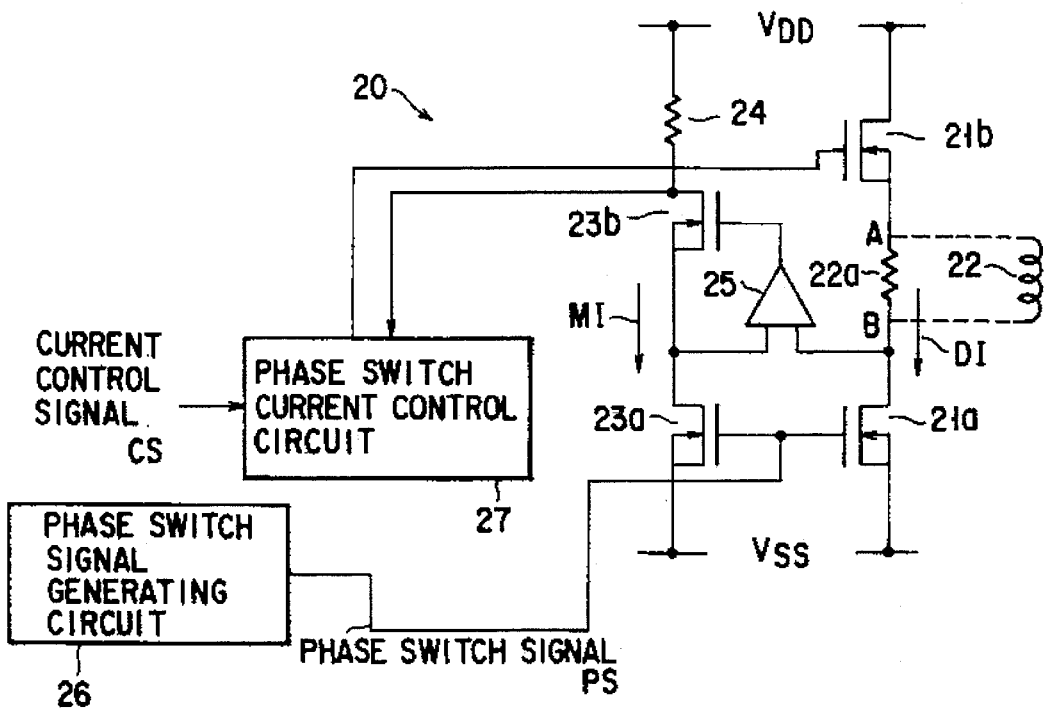
F I G. 7A

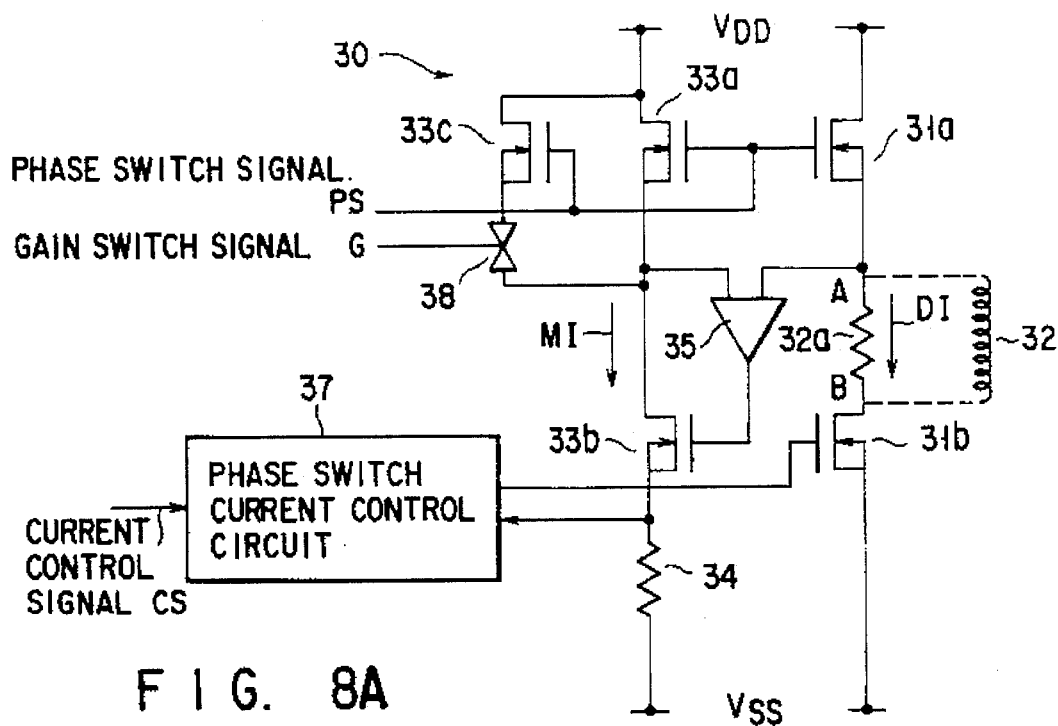
F I G. 8A
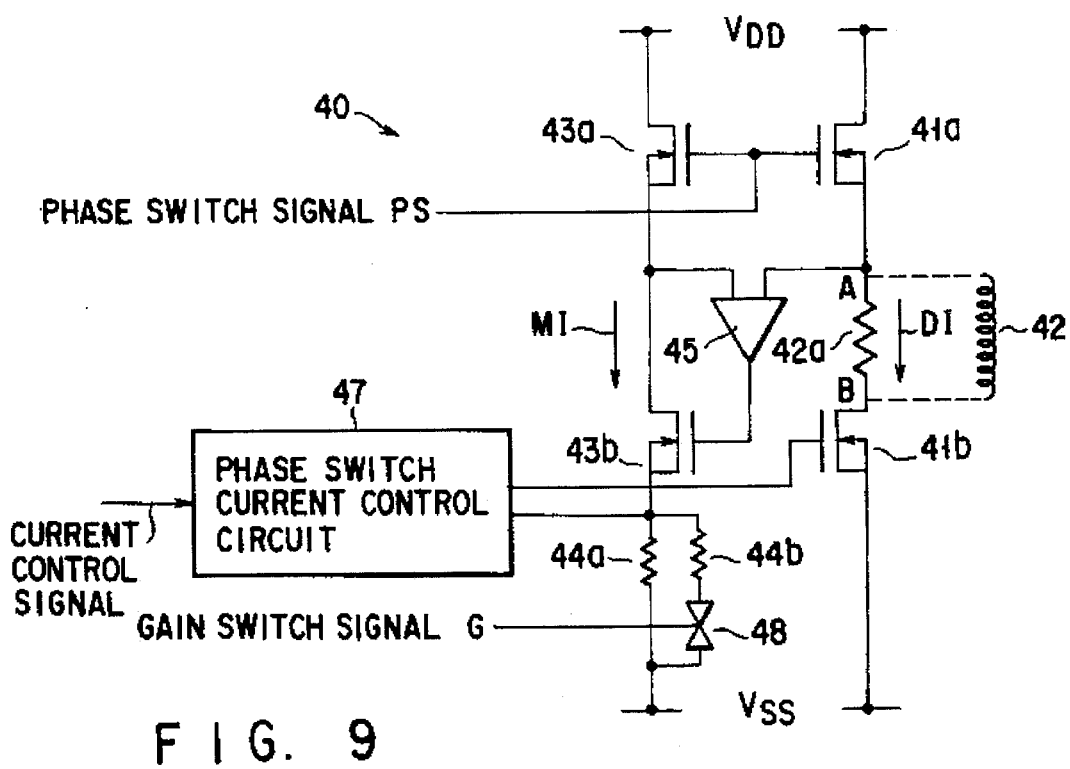
F I G. 9

CURRENT MIRROR CIRCUIT CONSTITUTED BY FET (FIELD EFFECT TRANSISTOR) AND CONTROL SYSTEM USING THE SAME

BACKGROUND OF THE INVENTION

1. Field of the Invention

The present invention relates to a current mirror circuit for use in, e.g. a motor control circuit for controlling a spindle motor employed in a hard disk drive, and a control system to which the current mirror circuit is applied.

2. Description of the Related Art

A spindle motor for rotating a disk at high speed is provided in, e.g. a conventional hard disk drive (HDD). The movement (rotation) of the spindle motor is controlled by a current control type motor control apparatus. FIG. 1 shows an example of the current control type motor control apparatus. In general, a current control type motor control apparatus 1 comprises a current control circuit 2, a phase switch signal generating circuit 3 and a driver circuit 4. A motor driving signal is supplied to phase coils 5a to 5c of a three-phase motor 5 which is to be controlled.

The current control circuit 2 is connected to a power supply (power supply voltage VCC) and supplies a drive current to the driver circuit 4 in accordance with a current control signal (target current value) supplied from a control unit such as a CPU (Central Processing Unit). As is shown in FIG. 1, the current control circuit 2 includes a current detection resistor 2a, a current control transistor 2b and an operational amplifier 2c. The operational amplifier 2c compares a signal (detection voltage) representing a drive current value detected by the resistor 2a with a current control signal, and applies a base voltage corresponding to an error between the drive current value and the target current value to the base of the current control transistor 2b. Thereby, the operation of the current control transistor 2b is controlled, and a desired driver current is supplied to the driver circuit 4.

The driver circuit 4 switches the direction of currents flowing to, e.g. the phase coils 5a to 5c of the three-phase motor 5 in accordance with phase switch signals supplied from the phase switch signal generating circuit 3. FIG. 2A shows an example of the driver circuit 4. As is shown in FIG. 2A, the driver circuit 4 is an H-bridge circuit having MOS (Metal Oxide Semiconductor) type field effect transistors (MOS-FETs) 4a to 4f. The driver circuit 4 supplies drive currents to the phase coils 5a to 5c, with the current control circuit 2 employed as a current source. The MOS-FETs 4a to 4f function as switches. Specifically, MOS-FETs 4a, 4c and 4e function as switches between the current source 2 and the phase coils 5 of the motor, and MOS-FETs 4b, 4d and 4f function as switches between the phase coils 5 and the ground.

For example, when a drive current is supplied from the phase coil 5a to the phase coil 5b, the phase switch signal generating circuit 3 outputs phase switch signals to the driver circuit 4 to turn on the MOS-FETs 4a and 4d. FIG. 2B illustrates schematically the case where the drive current is supplied from the phase coil 5a to the phase coil 5b. A composite resistor constituted by series-connecting the phase coils 5a and 5b is shown as a load resistor 5ab. Thus, a series circuit, in which a drive current flows from the current control circuit 2 to the FET 4d via the FET 4a and load resistor 5ab (phase coils 5a and 5b), is constituted.

With the above structure, the motor control apparatus 1 supplies a desired drive current via a desired path to the phase coils 5 of the motor to be controlled.

On the other hand, in these years, various electronic devices having the aforementioned motor control apparatus have decreased in size and operational voltage more and more. In particular, the aforementioned HDD is applied to a storage apparatus such as a small-sized personal computer or a portable computer. It is expected that 2.5-inch media (recording media) widely used at present will be replaced with 1.8-inch media and the operation voltage will decrease from 5 V to 3 V. with this tendency of smaller size and lower operational voltage, the following problems will occur in the aforementioned current control type motor control apparatus 1.

Since the current detection resistor 2a of current control circuit 2 is connected in series with the driver circuit 4 (motor 5 including phase coils 5a to 5c), a voltage loss occurs due to current detection. Moreover, since the current control transistor 2b is provided, a voltage loss occurs in a VCE saturation voltage (collector-emitter voltage) at the transistor 2b. A description will now be given of the case where a drive current flows from the phase coil 5a to the phase coil 5b, as shown in FIG. 2B.

With reference to FIG. 2B, suppose that a voltage drop due to the current detection resistor 2a is V1, and a saturation voltage across the collector and emitter of the current control transistor 2b is VCE. In addition, suppose that a drain-source resistance at the time of turn-on of the MOS-FETs 4a and 4d of driver circuit 4 is RON and a composite resistor 5ab is Rcoil. In this case, a drive current (I) supplied to the motor (phase coils 5a and 5b) is given by $$I = \frac{VCC - (V1 + VCE)}{(2 \times RON + Rcoil)}$$

Thus, when the spindle motor requiring a large drive current is actuated, a voltage loss (V1 due to current detection resistor 2a; collector-emitter saturation voltage VCE of current control transistor 2b) will occur. Consequently, a driving torque of the spindle motor decreases.

Specifically, suppose that the power supply voltage is 5 V, the current detection resistance 2a is 0.5Ω, the VCE saturation voltage is 0.3 V, the resistance of MOS-FET 4a, 4d is 1.0Ω, and the composite resistance (coils 5a and 5b) of the motor 5 is 5.0Ω. Under these conditions, a maximum value I of a drive current capable of being supplied to the motor 5 is 723 mA. However, for example, because of the aforementioned tendency of lower operational voltage, if the power supply voltage is 3.3V, the maximum value I of the drive current is 461 mA, and the maximum current value decreases by about 36%, as compared to the case where the power supply voltage is 5 V. Accordingly, the driving torque decreases. Thus, when the motor such as a spindle motor is driven at low voltage, a current control system with high driving efficiency is needed.

In addition, a voltage drop due to the current detection resistor 2a is proportional to the magnitude of drive current. In order to reduce the aforementioned voltage loss, the drive current may be increased by decreasing the resistance value of the current detection resistor 2a. However, in this case, the precision of current value detection by the current detection resistor 2a deteriorates. As a result, an exact current value of a current to be detected cannot be detected. That is, a signal (representing a detection voltage) having a predetermined ratio to the magnitude of drive current cannot be output.

SUMMARY OF THE INVENTION

A first object of the present invention is to provide a motor control system capable of increasing the value of a current supplied to a motor such as a spindle motor, and increasing a driving torque.

A second object of the invention is to provide a current control system capable of exactly detecting the value of a current supplied to a load such as a motor, and effecting current control with high precision.

A third object of the invention is to provide a circuit capable of generating a signal having a value of a predetermined ratio to a value of a current to be controlled.

According to a first aspect of the invention, there is provided a motor control system comprising: drive current supply means for supplying a drive current to a phase coil of a motor, the drive current supply means having a first FET (Field Effect Transistor) for effecting current control; mirror current generating means for generating a mirror current having a current value of a predetermined ratio to a current value of the drive current, the mirror current generating means having a second FET; current detection means for detecting the current value of the mirror current; and current control means for controlling the first FET on the basis of the current value of the mirror current detected by the current detection means, and controlling the current value of the drive current.

The motor control system includes a third FET with a sell ratio different from that of the second FET, for supplying the drive current to the phase coil of the motor, a gate of the third FET being connected to a gate of the second FET in order to generate the mirror current, and the current control means compares the current value of the mirror current with a predetermined target current value, and controls the first FET on the basis of a comparison result.

The motor control system further comprises voltage control means for making a first source-drain voltage of the second FET equal to a second source-drain voltage of the third FET.

According to a second aspect of the invention, there is provided a motor control method for use in a motor control system for controlling the rotational movement of a motor, the motor control system having a first FET (Field Effect Transistor) for effecting current control and a second FET, the method comprising the steps of: a) supplying a drive current to a phase coil of the motor; b) generating a mirror current having a current value of a predetermined ratio to a current value of the drive current, with use of the second FET; c) detecting the current value of the mirror current; and d) controlling the first FET on the basis of the current value of the mirror current detected in the detecting step, thereby controlling current value of the drive current.

In the motor control method includes a third FET for supplying the drive current to the phase coil of the motor, the third FET having a gate connected to a gate of the second FET, in the step (a) the drive current is supplied to the phase coil of the motor by use of the third FET, and in the step (d) the current value of the mirror current is compared with a target current value, and on the basis of a comparison result the first FET is controlled.

The motor control method further comprises the step of making a first source-drain voltage of the second FET equal to a second source-drain voltage of the third FET.

According to the above structures, a circuit for generating a mirror current is provided, separately from a circuit for supplying a drive current. The mirror current generating circuit generates a mirror current of a predetermined ratio to the generated drive current. A circuit for detecting a current detects the mirror current for the purpose of current control. On the basis of the detected mirror current, the operation of a current control FET (the first FET) is controlled, and the amount of the drive current to be supplied to a motor is controlled. Thus, a decrease in the drive current due to a current source-side voltage loss can be prevented. In addition, power consumption due to current detection can be reduced, and as a result the drive current can be supplied efficiently. Therefore, motor control with high efficiency capable of preventing a decrease in driving torque of the motor can be obtained.

According to a third aspect of the invention, there is provided a current control system comprising: drive current supply means for supplying a drive current to a desired circuit, the drive current supply means having a first FET (Field Effect Transistor) for effecting current control; mirror current generating means for generating a mirror current having a current value of a predetermined ratio to a current value of the drive current, the mirror current generating means having a second FET; current detection means for detecting the current value of the mirror current; and current control means for controlling the first FET on the basis of the current value of the mirror current detected by the current detection means, and controlling the current value of the drive current.

In the current control system includes a third FET with a cell ratio different from that of the second FET, for supplying the drive current to the desired circuit, a gate of the third FET being connected to a gate of the second FET in order to generate the mirror current, and the current control means compares the current value of the mirror current with a predetermined target current value, and controls the first FET on the basis of a comparison result.

The current control system further comprises voltage control means for making a first source-drain voltage of the second FET equal to a second source-drain voltage of the third FET.

According to a fourth aspect of the invention, there is provided a current control method for use in a current control system for effecting current control of a desired circuit, the current control system having a first FET (Field Effect Transistor) for effecting current control and a second FET, the method comprising the steps of: a) supplying a drive current to the desired circuit; b) generating a mirror current having a current value of a predetermined ratio to a current value of the drive current, with use of the second FET; c) detecting the current value of the mirror current; and d) controlling the first FET on the basis of the current value of the mirror current detected in the detecting step, thereby controlling the current value of the drive current.

The current control method includes a third FET for supplying the drive current to the circuit, the third FET having a gate connected to a gate of the second FET, in the step (a) the drive current is supplied to the circuit by use of the third FET, and in the step (d) the current value of the mirror current is compared with a target current value, and on the basis of a comparison result the first FET is controlled.

The current control method further comprises the step of making a first source-drain voltage of the second FET equal to a second source-drain voltage of the third FET.

According to these structures and methods, a problem of current detection precision due to resistance for current detection can be solved, and current control precision can be enhanced. Furthermore, a decrease in drive current due to a current source-side voltage loss can be prevented. Therefore, a current can be supplied efficiently to a desired circuit to be controlled.

According to a fifth aspect of the invention, there is provided a current mirror circuit comprising: a first FET for transmitting a predetermined first current; a second FET for producing a mirror current of a predetermined ratio to a current value of the first current; and holding means for holding the predetermined ratio of the mirror current at a constant value by making a source-drain voltage of the first FET equal to a source-drain voltage of the second FET.

The current mirror circuit is connected to a gate of the second FET, and the holding means includes an operational amplifier having input terminals connected to a source of the first FET and a source of the second FET, and a third FET having a gate connected to an output terminal of the operational amplifier and being connected to the source of the second FET.

In the other case, in the current mirror circuit, the first FET is connected to a gate of the second FET, and the holding means includes an operational amplifier having input terminals connected to a drain of the first FET and a drain of the second FET, and a third FET having a gate connected to an output terminal of the operational amplifier and being connected to the source of the second FET.

With the above structure, the sell ratio between the first and second FETs is set at a predetermined value. The drive current is supplied to a circuit to be controlled via the first FET. By making the source-drain voltage of the first FET equal to that of the second FET, the mirror current output via the second FET is controlled in accordance with a variation in a circuit load to which the mirror current is supplied. When the FET (the third FET) is used for such control, the variation in the circuit load to which the mirror current is supplied can be corrected by the resistance value. Therefore, according to the above-described current mirror circuit, a mirror current having a constant ratio to a current supplied to the first FET can be exactly produced.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a block diagram showing the structure of a conventional motor control apparatus;

FIGS. 2A an 2B are views for illustrating the structure of a driver circuit shown in FIG. 1 and connection between the driver circuit and peripheral elements, FIG. 2A showing an example of the driver circuit, and FIG. 2B showing a state in which a current is supplied to phase coils as shown in FIG. 2A;

FIGS. 3A to 3C are circuit diagrams each showing the structure of a motor control system according to a first embodiment of the present invention;

FIG. 5 is a circuit diagram of a current mirror circuit according to the present invention, which is applied to the motor control system as shown in FIGS. 3A to 3C;

FIGS. 7A to 7C are circuit diagrams each showing the structure of a motor control system according to a second embodiment of the invention;

FIGS. 8A to 8C are circuit diagrams each showing the structure of a motor control system according to a third embodiment of the invention;

FIG. 9 is a circuit diagram showing the structure of a motor control system according to a fourth embodiment of the invention;

DETAILED DESCRIPTION OF THE PREFERRED EMBODIMENTS

Figure 3C:
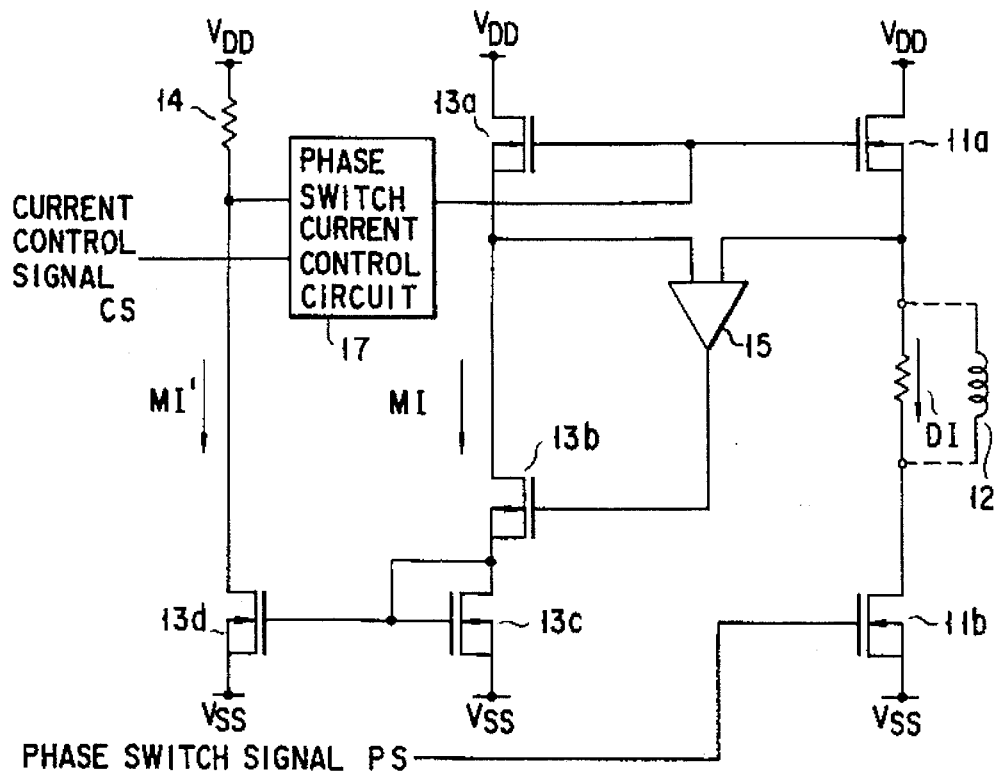

Motor control systems according to first to fourth embodiments of the present invention, a current control system according to the invention and a mirror circuit according to the invention will now be described with reference to the accompanying drawings.

FIG. 3A shows a basic unit structure of a motor control system according to the present invention. As is shown in FIG. 3A, a motor control system 10 includes a circuit for supplying a drive current DI in which MOS type field effect transistors (MOS-FETs) 11a and 11b and a load resistor 12a corresponding to an excitation coil of a motor 12 are connected in series. The motor control system 10 also includes a circuit in which MOS-FETs 13a and 13b and a current detection resistor 14 are connected in series. In addition, the motor control system 10 includes an operational amplifier 15. An output terminal of the operational amplifier 15 is connected to a gate of the FET 13b. One of two input terminals of the operational amplifier 15 is connected to a source of the FET 11a and the load resistor 12a, and the other input terminal of the operational amplifier 15 is connected to a gate of the FET 13a and a drain of the FET 13b.

A gate of the FET 11a and a gate of the FET 13a are connected to each other and are supplied with a phase switch signal PS. The FETs 11a and 13a are switched in accordance with the phase switch signal PS. The source of the FET 11a is connected to an end portion of the load resistor 12a via a load connection terminal A, thereby controlling the switching of supply of the drive current DI. A cell ratio of the FET 13, to the FET 11a is set at 1:N in advance. Accordingly, the FET 13a generates a mirror current MI of a predetermined ratio (1/N multiplication) of the drive current DI. In general, since the FET consists of a plurality of cells, each cell having a same size, a FET of a large size consists of a large number of cells and a FET of a small size consists of a small number of cells. Therefore, the cell ratio indicates the number of cells of one FET to that of other FET and means a size ratio of FETs. A source of the FET 13a is connected to the drain of the FET 13b and the associated input terminal of the operational amplifier 15. The phase switch signal PS to be supplied to the gates of the FETs 11a and 13a is output from a phase switch signal generating circuit 16 for switching the direction of current flowing to coils to be controlled by the motor control system 10. The details will be described later.

A drain of the FET 11b is connected to an end portion of the load resistor 12a via a load connection terminal B, and a gate thereof is connected to a phase switch current control circuit 17. A gate voltage to the FET 11b is controlled by the phase switch current control circuit 17, thereby effecting current control of drive current DI supplied to the motor as well as switch control. A gate voltage to the FET 13b is controlled by the operational amplifier 15 so that the source-drain voltage of the FET 11a may become equal to that of the FET 13a. Thus, the source-drain voltage of the FET 11a is made equal to that of the FET 13a.

In relation to the drive current DI flowing through the circuit constituted by the FETs 11a and 11b and load resistor 12a, the mirror current MI exactly proportional to a predetermined mirror ratio flows through the circuit constituted by the FETs 13a and 13b and current detection resistor 14.

The mirror current will now be described. An expression "to mirror a current" means "to generate a current having a value of a specific ratio to the value of a current flowing in a given circuit." A current produced by mirroring a current is called a "mirror current." A circuit for generating such a mirror current is called a "current mirror circuit."

The current detection resistor 14 is a resistor for detecting the mirror current MI, and applies a detection voltage corresponding to the mirror current MI to the phase switch current control circuit 17. The control circuit 17 compares the detected mirror current MI with a current control signal (target current value) CS supplied from a control unit (not shown) such as a CPU, and outputs a gate voltage corresponding to an error in current value to the current control FET 11b. Thus, the ON-time resistance of the current control FET 11b is controlled to control the drive current DI.

Figure 10:
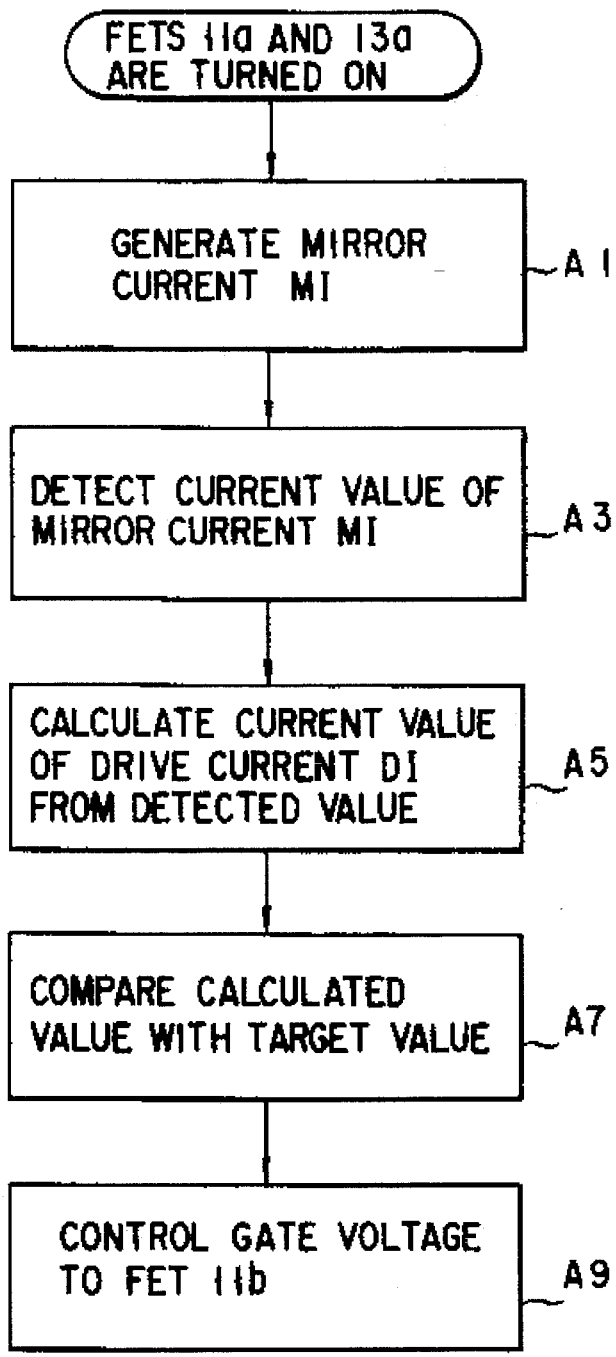
FIG. 10 is a flowchart of an operation of the first embodiment.

The operation of the motor control system as shown in FIG. 3A will now be described by referring FIG. 10.

Regarding the motor control system as shown in FIG. 3A, in the circuit configuration including the FETs 11a and 11b, current detection is effected by the current detection resistor 14 on the VSS side. The circuit configuration including the FETs 11a and 11b is a drive current circuit in which an H-type bridge is constituted by the FETs 11a and 11b.

The gate voltage to the FET 11b is controlled by the phase switch current control circuit 17 so that the FET 11b can effect both control of drive current DI and switch control. Specifically, the FET 11b has a function of a current source for supplying a drive current to the motor as well as a function of a power supply switch. In response to the phase switch signal PS, the FET 11a is turned on and the drive current DI flows from the drain to the source. At the same time, the FET 13a is also turned on and a mirror current having a current value of a predetermined ratio to a current value of the drive current DI is output from the source of the FET 13a (step A1). In addition, a voltage corresponding to the current value of the mirror current is supplied from the current detection resistor 14 to the phase switch current control circuit 17. In the phase switch current control circuit 17, the current value of the mirror current is found from the supplied voltage (step A3). The phase switch current control circuit 17 calculates the current value of the drive current on the basis of the current value of the mirror current (step A5). Specifically, the current value of the drive current is calculated by making use of the fact that the ratio between the current value of the mirror current and that of the drive current is already known. Furthermore, the phase switch current control circuit 17 compares the target current value represented by the current control signal with the calculated current value of the drive current, and outputs a gate voltage corresponding to the error to the FET 11b (steps A7 and A9).

In the motor control system 10, the mirror current MI output from the source of the FET 13a is utilized as a detection current necessary for controlling the motor drive current DI. If the cell construction ratio of the FET 13a for outputting the mirror current MI to that of the FET 11a is set at 1:N, the mirror current MI can be set at 1/N of the drive current value. Accordingly, the power consumption for conventional current detection can be remarkably reduced.

By adopting the current detection system utilizing the mirror current MI, it is possible to dispense with the current detection resistor, provided on the current source side apart from the drive current circuit, and the current control transistor, as shown in FIG. 1. Thereby, it is possible to prevent a voltage loss due to the current detection resistor and/or the current control transistor. Accordingly, the drive current DI corresponding to the power supply voltage can be supplied to the motor with high efficiency, without reducing the drive current DI due to the voltage loss.

By adopting the current detection system utilizing the mirror current MI, current detection can be effected with a small current and the power consumption can be reduced. In the case where a power supply voltage of, e.g. 3.3 V is used, if the ON-time source-drain resistance of the FET 11b is 1.0Ω and the DC resistance (load resistance 12a) of the motor is 5.0Ω, the motor activation current can be set at 550 mA.

In the prior art, as mentioned above, the maximum value I of the drive current is 461 mA. By contrast, in the present invention, the maximum value I of the drive current can be increased by about 20%.

In the present embodiment, it is desirable that the constituent elements be constituted as an integrated circuit, in order to exactly determine the cell construction ratio between the FET 11a and FET 13a.

Figure 4:
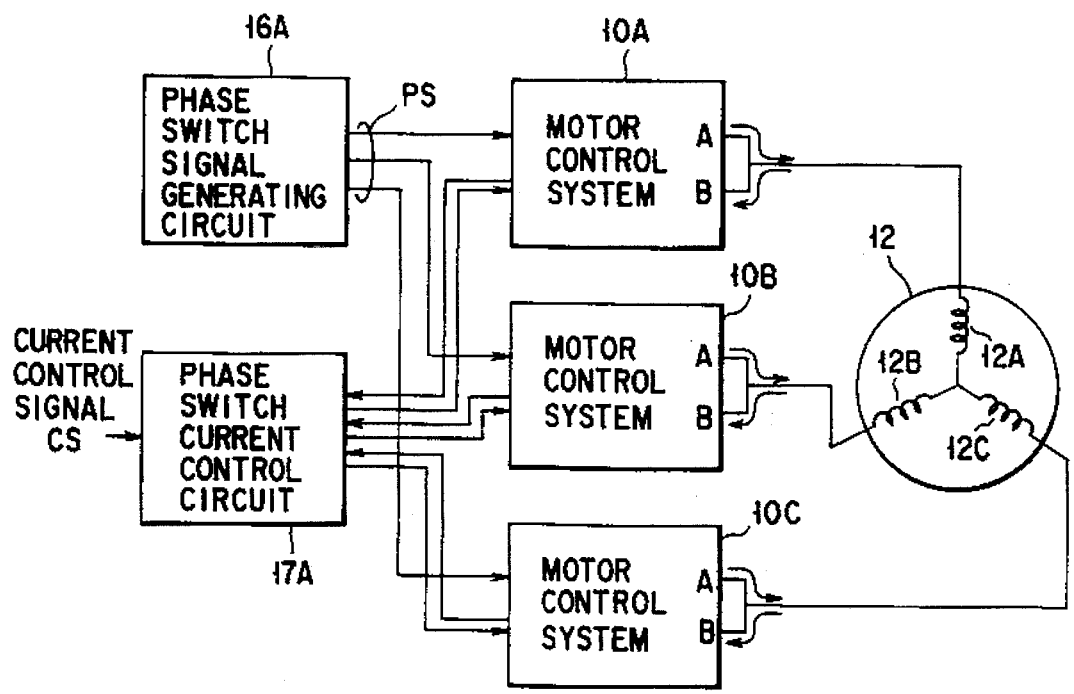
FIG. 4 is a block diagram showing the motor control system according to the first embodiment as shown in FIG. 3A to 3C, which is applied to the control for a three-phase motor.

FIG. 4 shows circuit connection in the case where the motor control system according to the present embodiment is applied to the control for the three-phase motor. Three motor control systems (10A to 10C) are used to control drive currents supplied to the phase coils 12A to 12C of the motor 12 to be controlled. The motor control systems 10A to 10C are connected to predetermined terminals of the phase coils 12A to 12C of the motor 12, instead of the load resistor 12a as shown in FIG. 3A. Specifically, load connection terminals A and B of the motor control system 10A are connected to the phase coil 12A, load connection terminals A and B of the motor control system 10B are connected to the phase coil 12B, and load connection terminals A and B of the motor control system 10C are connected to the phase coil 12C.

When the drive currents are actually supplied to the motor 12, however, it is necessary for the phase switch current control circuit 17A to control drain voltages to the FETs 11b of the respective motor control systems 10A to 10C so that the drive currents may be controlled in the motor control systems 10A to 10C.

For example, when the drive current is supplied from the phase coil 12A to the phase coil 12B, the FET 11b of the motor control system 10A cannot control the drive current. Thus, it should suffice if the phase switch current control circuit 17A turns off the source-drain current path of the FET 11b of the motor control system 10A. The reason for this is that the drive current supplied to the load connection terminal A of the motor control system 10A is delivered to the load connection terminal B of the motor control system 10B via the phase coils 12A and 12B. In other words, in order to control the value of the drive current supplied to the phase coils 12A and 12B, the phase switch current control circuit 17A needs to detect the drive current value in accordance with the voltage supplied from the current detection resistor 14 of the motor control system 10A and to control the gate voltage of the FET 11b of the motor control system 10B.

A description will now be given of a current mirror circuit according to the present invention, which is applied to the motor control system as shown in FIG. 3A. FIG. 5 shows circuit connection of the current mirror circuit.

A current source 18 outputs a drive current of a predetermined value on the basis of a power supply voltage Vdd. An output terminal of the current source 18 is connected to drains of FETs 11a and 13a. The FETs 11a and 13a are constituted so as to have an equal cell ratio. The drive current is supplied to a circuit load 12a via a source-drain current path of the FET 11a. A voltage at a current output terminal of the circuit load 12a is Vss. The gates of the FETs 11a and 13a are connected to each other, and an on/off signal for controlling the turning-on/off of the FETs 11a and 13a is supplied to the gates. The source-drain current paths of the FETs 11a and 13a are turned on/off in accordance with the on/off signal. One of two input terminals of an operational amplifier 15 is connected to the source of the FET 11a, and the other input terminal thereof is connected to the source of the FET 13a and to the drain of the FET 13b. The operational amplifier 15 controls the FET 13b so that the source-drain voltages of the FETs 11a and 13a are equalized. Thereby, a mirror current output via the FET 13b is controlled in accordance with a variation in the circuit load to which the mirror current is output.

A description will now be given of the technical feature that the current mirror circuit is constituted by FETs, the resistance value of the FET is controlled, and the mirror current is controlled on the basis of this resistance value.

In this current mirror circuit, the mirror current is produced by the FET 13a in relation to the current supplied to the FET 11a. Supposing that the load to the current mirror circuit is constant, the ratio of the sum of the resistance due to the FET 13a and the load, to which the mirror current is supplied, to the sum of the resistance due to the FET 11a and the resistance due to the circuit load 12a is a mirror ratio. That is, mirror ratio=(resistance of FET 13a+load to which mirror current is supplied) : (resistance of FET 1a+circuit load 12a)

This relationship indicates that even if each circuit load of the mirror circuit is constant, the mirror ratio will vary due to a variation in the load of the circuit to which the mirror current is supplied. The FET 13b and operational amplifier 15 are provided, as described above, in order to make the mirror ratio constant, irrespective of the variation in the load of the circuit to which the mirror current is supplied.

The mirror current is controlled by the FET 13b and operational amplifier 15 so as to equalize the source-drain voltages of the FETs 11a and 13a. Thereby, the variation in the load of the circuit to which the mirror current is supplied can be compensated on the basis of the source-drain resistance value of the FET 13b.

According to the above-described current mirror circuit, a mirror current of a predetermined ratio can exactly be produced in relation to the current supplied to the FET 11a.

Figure 6A:
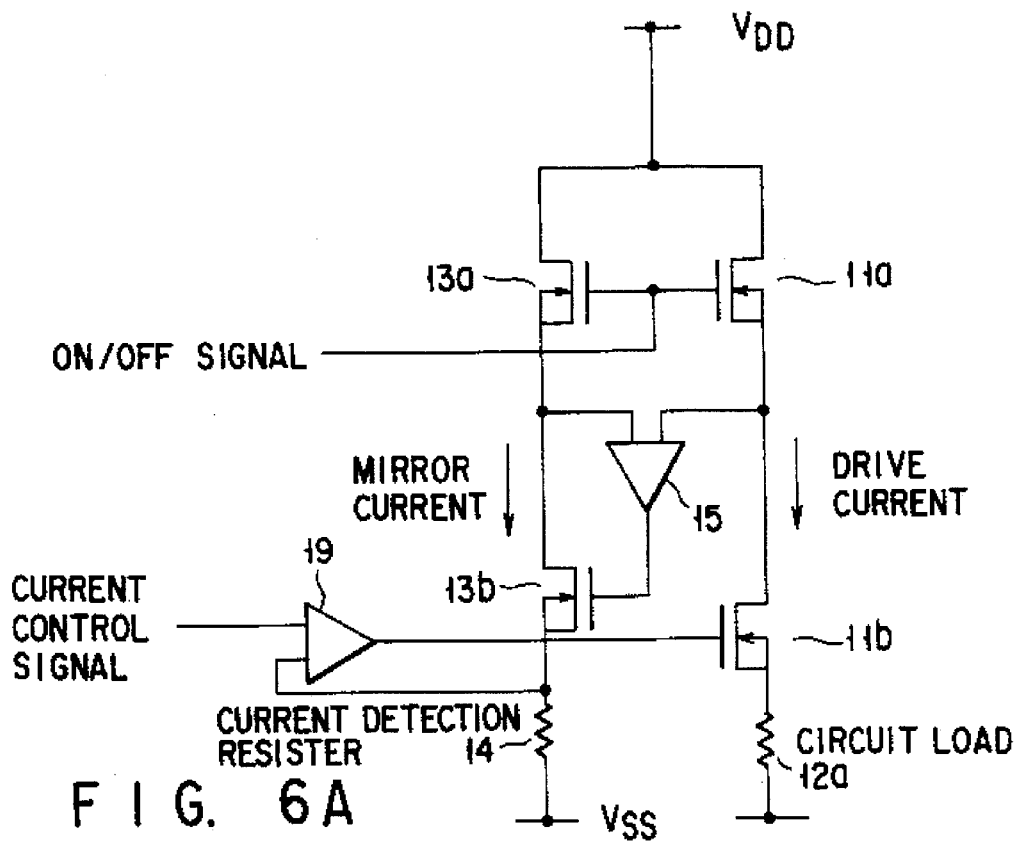
FIGS. 6A and 6B illustrate a current control system according to the present invention, which is applied to the motor control system as shown in FIGS. 3A to 3C, FIG. 6A showing a circuit structure of the current control system, and FIG. 6B showing a circuit structure of a conventional current control system.

A description will now be given of a current control system according to the present invention, which is applied to the motor control system as shown in FIG. 3A. FIG. 6A shows a circuit configuration of this current control system, and FIG. 6B shows a circuit configuration of a conventional current control system.

The current control system as shown in FIG. 6A has a structure similar to that of the motor control system as shown in FIG. 3A, and a detailed description thereof is omitted. In this current control system, an on/off signal, in place of the phase switch signal PS, is supplied to the gates of FETs 11a and 13a. The on/off signal is a signal for controlling the turning-on/off of the source-drain current paths of the FETs 11a and 13a, and the on/off signal differs from the phase switch signal PS only with respect to the technical term given to it. In the current control system, the load (circuit load) connected between the terminals A and B in the motor control system 10 is connected to the source of the FET 11b. In this current control system, a current control operational amplifier 19 is substituted for the phase switch current control circuit 17 employed in the motor control system 10. The operational amplifier 19 receives a mirror current detected by the current detection resistor 14 and a target value current indicated by the current control signal. Based on these inputs, the operational amplifier 19 controls the gate voltage to the FET 11b. Since the operation of the current control system is the same as that of the motor control system as shown in FIG. 10, a detailed description thereof is omitted.

Figure 6B:
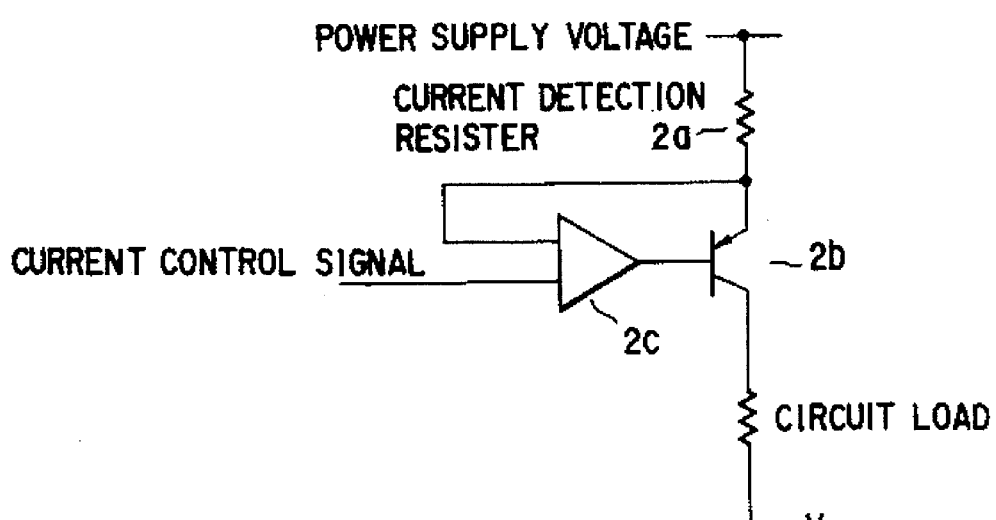

A conventional current control system as shown in FIG. 6B is applied to the motor control apparatus as shown in FIG. 1. The common structural elements are denoted by like reference numerals.

Current control techniques of the current control systems as shown in FIGS. 6A and 6B will now be compared with use of specific numerical values. For example, suppose that in the conventional current control system, power supply voltage: 5 V current detection resistance: 0.5Ω transistor saturation voltage: 0.3 V circuit load: 5Ω.

A maximum current, which can be supplied from the current control system, is about 855 mA. The maximum current can be increased by decreasing the resistance value of the current detection resistor. In this method, however, the precision of the current detection resistance deteriorates and consequently the precision of the current detection deteriorates.

On the other hand, suppose that in the current control system as shown in FIG. 6A, power supply voltage: 5 V FET on resistance: 0.5Ω circuit load: 5Ω.

A maximum current, which can be supplied from the current control system, is about 909 mA, and the driver efficiency can be increased about 63%, as compared to the prior art. In addition, the aforementioned problem regarding the current detection precision due to the current detection resistor of the conventional current control system can be overcome, and the current control precision is enhanced.

A first modification of the above-described first embodiment will now be described. FIG. 3B shows a circuit configuration of the first modification of the first embodiment described with reference to FIG. 3A. The motor control system as shown in FIG. 3B differs from the motor control system 10 as shown in FIG. 3A in that the FET 11a (along with the FET 13a) is used for generating a mirror current and for current control including phase switch control. Specifically, the mirror current MI is generated in relation to drive current DI in accordance with the cell construction ratio between the FET 11a and FET 13a.

This first modification differs from the motor control system 10 as shown in FIG. 3A with respect to the circuit connection described below. The FETs 11a and 13a are supplied with signals for gate voltage control from the phase switch current control circuit 17, thereby effecting current control including phase switch control, as described above. Since current control for the FET 11b is effected by the FET 11a, the FET 11b is used only for switch control. Thus, the phase switch signal PS is supplied to the gate of the FET 11b from a phase switch signal generating circuit (not shown), and the switch control is effected in accordance with the phase switch signal PS. Except this, the circuit structure of the first modification is the same as that of the motor control system 10, and therefore a detailed description thereof is omitted.

The operation of the first embodiment is substantially the same as that of the motor control system 10 described with reference to FIG. 10. In step A9 in FIG. 10, however, the gate voltage to the FET 11b is controlled to control the drive current DI. As has been described above, in this first modification, the drive current DI is controlled by the FET 11a. Thus, in the first modification, the value of the drive current is calculated from the value of the mirror current and thereafter the target current value represented by the current control signal is compared with the calculated value of the drive current. A gate voltage corresponding to an error between the target current value and the calculated value of the drive current is supplied to the FET 11a (and FET 13a). Thus, current control for the drive current DI is effected.

Even when the motor control system of the first modification is used, the same advantage as with the motor control system as shown in FIG. 3A can be obtained. Moreover, the first modification is effective in manufacturing an IC having both functions of generating a mirror current and controlling a current.

A second modification of the first embodiment will now be described with reference to FIG. 3C. The second modification differs from the first modification in that the former includes a two-stage mirror current generating circuit. Specifically, in the second modification, a first mirror current MI is generated by the FETs 11a and 13a, and a second mirror current MI' obtained by mirroring the mirror current MI is generated from the FETs 13c and 13d.

The circuit configuration of the second modification differs from that of the first modification as shown in FIG. 3B in the following point. In FIG. 3C, the source of the FET 13b is connected to the drain of the FET 13c in place of the current detection resistor 14. This drain is connected to the gate of the FET 13c, and the source voltage is Vss.

The gate of the FET 13c is connected to the gate of the FET 13d. The source voltage of the FET 13d is Vss, and the drain thereof is connected to the current detection resistor 14. The other terminal of the current detection resistor 14 is supplied with a power supply voltage VDD. Accordingly, the phase switch current control circuit 17 receives a voltage signal derived from a node between the FET 13d and the current detection resistor 14, and calculates a drive current DI from the voltage signal.

If the cell construction ratio between the FETs 11a and 13a is P:1 and the cell construction ratio between the FETs 13c and 13d is Q:1, the mirror current MI', i.e. the value of current flowing through the current detection resistor 14 is given by $$MI' = \frac{\text{drive current } DI}{P \times Q}$$

Since the operation of the second modification is substantially the same as that of the motor control system 10 described with reference to FIG. 10, a detailed description thereof is omitted. Like the first modification, in step A9, the gate voltage of the FET 11a is controlled by the phase switch current control circuit 17 in order to control the drive current DI.

In the operation of the second modification, the first mirror current MI (depending on the cell construction ratio between the FETs 11a and 13a) flows in response to turn-on of the FETs 11a and 13a, and at the same time the second mirror current MI' is obtained from the FETs 13c and 13d by mirroring the mirror current MI. A voltage value signal corresponding to the current value of the second mirror current MI' is delivered to the phase switch current control circuit 17.

Even when the motor control system of the second modification is used, the same advantage as with the motor control system as shown in FIG. 3A can be obtained. Moreover, in the second modification, the detection precision of the drive current can be enhanced, as compared to the motor control system as shown in FIG. 3A. Suppose, for example, that the ratio of the mirror current flowing through the current detection resistor 14 to the drive current is 1:100. In the second modification, it suffices that the cell construction ratio between the FETs 11a and 13a is 10:1 and the cell construction ratio between the FETs 13c and 13d is 10:1. On the other hand, in the motor control system as shown in FIG. 3A, it is necessary that the cell construction ratio between the FETs 11a and 13a be 100:1. In this case, the precision of the mirror current flowing through the FET 13a is decreased. Accordingly, the second modification is suitable to the case of obtaining a mirror current having a high mirror ratio with respect to the drive current DI.

The mirror circuit constituted by the FETs 13a and 13d may be constituted by NPN transistors. In this case, the resistance value of the resistor connected to the emitter may be 0 to several Ω.

A motor control system according to a second embodiment of the present invention will now be described. FIG. 7A shows a circuit configuration of the motor control system according to the second embodiment. In the second embodiment, as compared to the first embodiment, current detection is effected by a current detection resistor 24 on the VDD side. Specifically, the constituent cell ratio between VSS-side FETs 21a and 23a is set at N:1, and a mirror current MI is produced. On the basis of the gate voltage control by a phase switch current control circuit 27, the FET 21b effects control of drive current DI and switch control. The phase switch current control circuit 27 compares a mirror current MI detected by the current detection resistor 24 and a current control signal (target current value) CS, and outputs a gate voltage corresponding to an error in current value of both signals to the FET 21b.

In the case of using the motor control system as shown in FIG. 7A, the same advantageous effect as with the first embodiment shown in FIG. 3A can be obtained. Since the operation of the motor control system is the same as that illustrated in FIG. 10, a detailed description thereof is omitted. If this motor control system is applied to the control of a three-phase motor, the system as shown in FIG. 5 is employed.

Figure 7B:
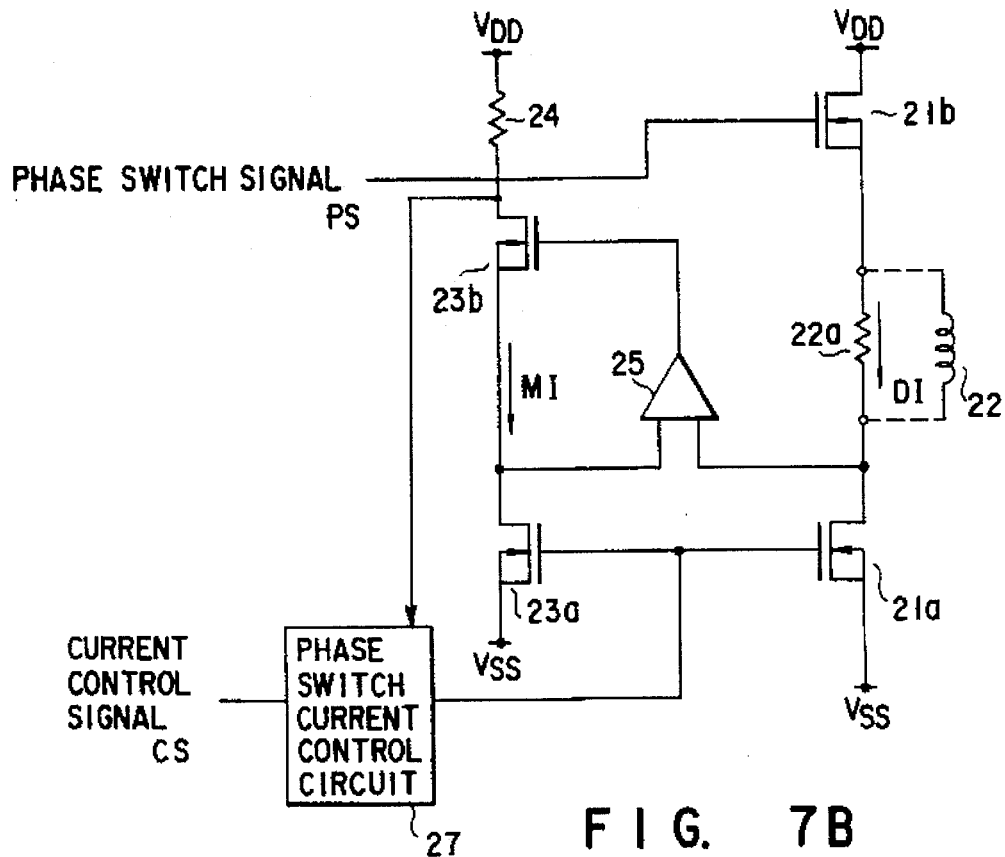

A first modification of the second embodiment will now be described. FIG. 7B shows a circuit configuration of the first modification of the second embodiment described with reference to FIG. 7A. The motor control system as shown in FIG. 7B differs from the motor control system 10 as shown in FIG. 3A in that the FET 21a (along with the FET 23a) is used for generating a mirror current and for current control including phase switch control. Specifically, the mirror current MI is generated in relation to drive current DI in accordance with the cell construction ratio between the FET 21a and FET 23a.

The first modification as shown in FIG. 7B of the second embodiment as shown in FIG. 7A is based on the same principle as the first modification as shown in FIG. 3B of the first embodiment as shown in FIG. 3A. Thus, a detailed description of the structure and operation of the first modification as shown in FIG. 7B is omitted.

Even when the motor control system of the first modification as shown in FIG. 7B is used, the same advantage as with the motor control system as shown in FIG. 7A can be obtained. Moreover, this first modification is effective in manufacturing an IC having both functions of generating a mirror current and controlling a current.

A second modification of the second embodiment will now be described with reference to FIG. 7C. The second modification differs from the first modification in that the former includes a two-stage mirror current generating circuit. Specifically, in the second modification, a first mirror current MI is generated by the FETs 21a and 23a, and a second mirror current MI' obtained by mirroring the mirror current MI is generated from the FETs 23c and 23d.

Figure 7C:
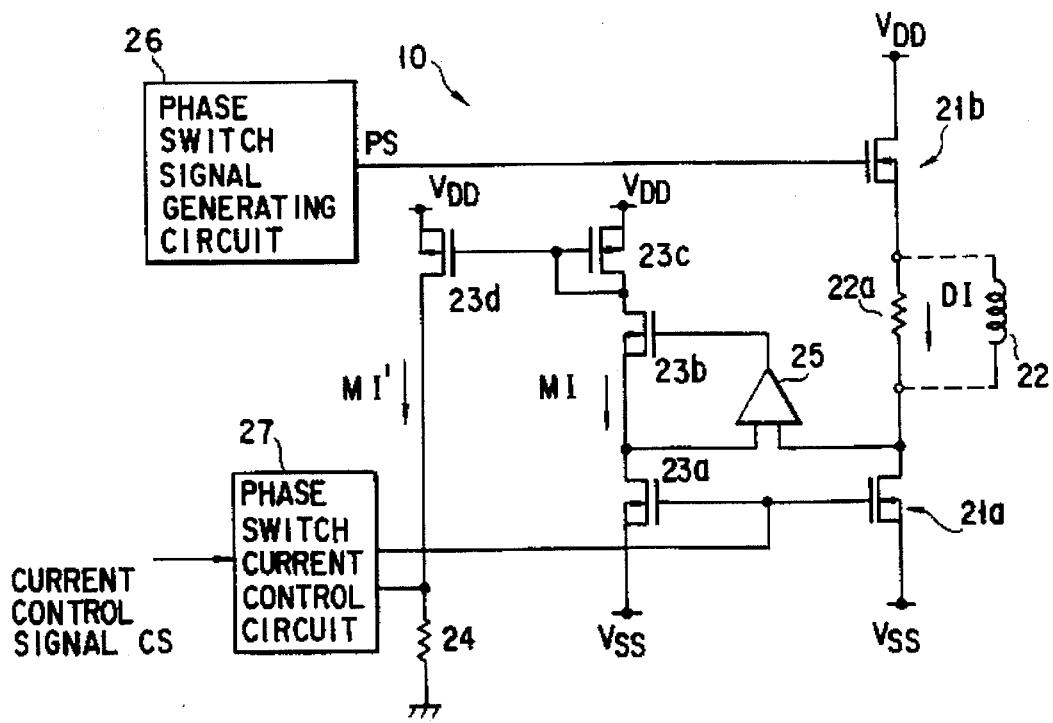

The second modification as shown in FIG. 7C of the second embodiment as shown in FIGS. 7A and 7B is based on the same principle as the second modification as shown in FIG. 3C of the first embodiment as shown in FIGS. 3A and 3B. Thus, a detailed description of the structure and operation of this second modification is omitted.

Even when the motor control system of the second modification is used, the same advantage as with the motor control system as shown in FIG. 7A can be obtained. Moreover, in the second modification, the detection precision of the drive current can be enhanced, as compared to the motor control system as shown in FIG. 7A. The reason for this has already been explained in connection with the second modification of the first embodiment as described with reference to FIG. 3C. The second modification is suitable to the case of obtaining a mirror current having a high mirror ratio with respect to the drive current DI.

In the first modification as shown in FIG. 7B, if the drive current DI increases, the detection voltage detected by the phase switch current control circuit 17 decreases. On the other hand, in the second embodiment as shown in FIG. 7C, if the drive current ID increases, the detection voltage detected by the phase switch current control circuit 17 increases. Thus, the gate voltage control to be effected by the phase switch current control circuit 17 can be set easily.

The mirror circuit constituted by the FETs 23c and 23d may be constituted by PNP transistors. In this case, the resistance value of the resistor connected to the emitter may be 0 to several Ω.

A motor control system according to a third embodiment of the invention will now be described with reference to the drawings. In the motor control system of the third embodiment, the control gain is switched and the current control precision is switched.

For example, if the maximum value of a current supplied to an object to be controlled, such as a spindle motor, is 1A and current control is effected by using an 8-bit D/A converter, a current which can be controlled with one bit is about 4 mA. However, the amount of current for activating the spindle motor differs greatly from that of current for controlling the number of rotations of the motor at a predetermined value.

Thus, the current control precision in units of about 4 mA is sufficient at the time of activating the motor with large current, but the current control precision in units of about 4 mA is insufficient at the time of controlling the rotation. In the third embodiment, the current control precision can be switched in accordance with the controlled amount of current.

The third embodiment with the function of switching the current control precision will now be described with reference to FIG. 8A. The system as shown in FIG. 8A differs from that shown in FIG. 3A in that a series circuit having series-connected FET 33c and analog switch 38 is connected in parallel between the source and drain of an FET 33a.

The FET 33c functions as a second FET for generating a mirror current. The switching operation of the analog switch 38 is controlled in accordance with a gain switch signal G supplied from a control unit (not shown) such as a CPU. A phase switch signal PS is input to the gate of the FET 33c. The current mirror ratio of the current mirror circuit is determined by a cell construction ratio of the FETs 33a and 33c to the FET 31a.

If two or more FETs having different cell construction ratios are used to output a mirror current, two or more kinds of mirror ratios can be obtained. Suppose that the cell construction ratio of the FET 31a is N, the construction cell number of the FET 33a is M1, and the construction cell number of the FET 33c is M2.

When the spindle motor is activated, a low-level signal is input to the analog switch 38 as gain switch signal G, thereby turning off the analog switch 38. Thus, a current with a magnitude of M2/N times the drive current DI flows as mirror current M1. On the other hand, when the number of rotations of the spindle motor has reached a predetermined value or more, a high-level signal is input to the analog switch 38 as gain switch signal G, thereby turning on the analog switch 38. Thus, a current with a magnitude (M1+M2)/N times the drive current DI flows as mirror current M1.

By switching the gain switch signal G at the time of activating the spindle motor and at the time of rotating the motor at a predetermined number of rotations or more, the current control precision can be switched between the time of activating the motor and the time of rotating the motor at a predetermined number of times or more. By switching the gain, different mirror currents MI flow in relation to the same drive current. Thus, the current flows with different ratios in relation to the same target current value. In other words, the current control precision at the time of rotating the spindle motor at a predetermined number of rotations or more is increased about (M1+M2)/M2 times than at the time of activating the spindle motor.

For example, suppose a motor control system wherein a current of 10 mA to 1 A is supported, a current detection resistance is 1Ω, and a ratio of a mirror current to a drive current can be switched between 1:100 or 1:10.

When the drive current of 1 A is supplied with a ratio of 1:100, the mirror current is 10 mA, and 10 mV is detected by the detection resistor. When the drive current of 1 A is supplied with a ratio of 1:10, the mirror current is 100 mA and 100 mV is detected. If an error of 1% occurs in current detection, 0.01 mV corresponds to the error of 1% in the case of the ratio of 1:100. In the case of the ratio of 1:10, 0.1 mv corresponds to the error of 1%. Thus, when the current is detected with the ratio of 1:100, an error in detected voltage due to noise, etc. influences greatly the detection of mirror current. On the other hand, in the case of the ratio of 1:100, even if detected voltage is influenced by noise, the detection of mirror current is not greatly influenced.

The operation of the third embodiment will now be described. The control unit for supplying a gain switch signal G to the analog switch 38 outputs a predetermined proper gain switch signal G in accordance with the target value represented by the current control signal CS. Specifically, the control unit controls the analog switch 38 so as to generate a proper mirror current, before outputting the phase switch signal PS. Since the subsequent operation is the same as the operation illustrated in FIG. 10, a detailed description thereof is omitted.

Figure 11:
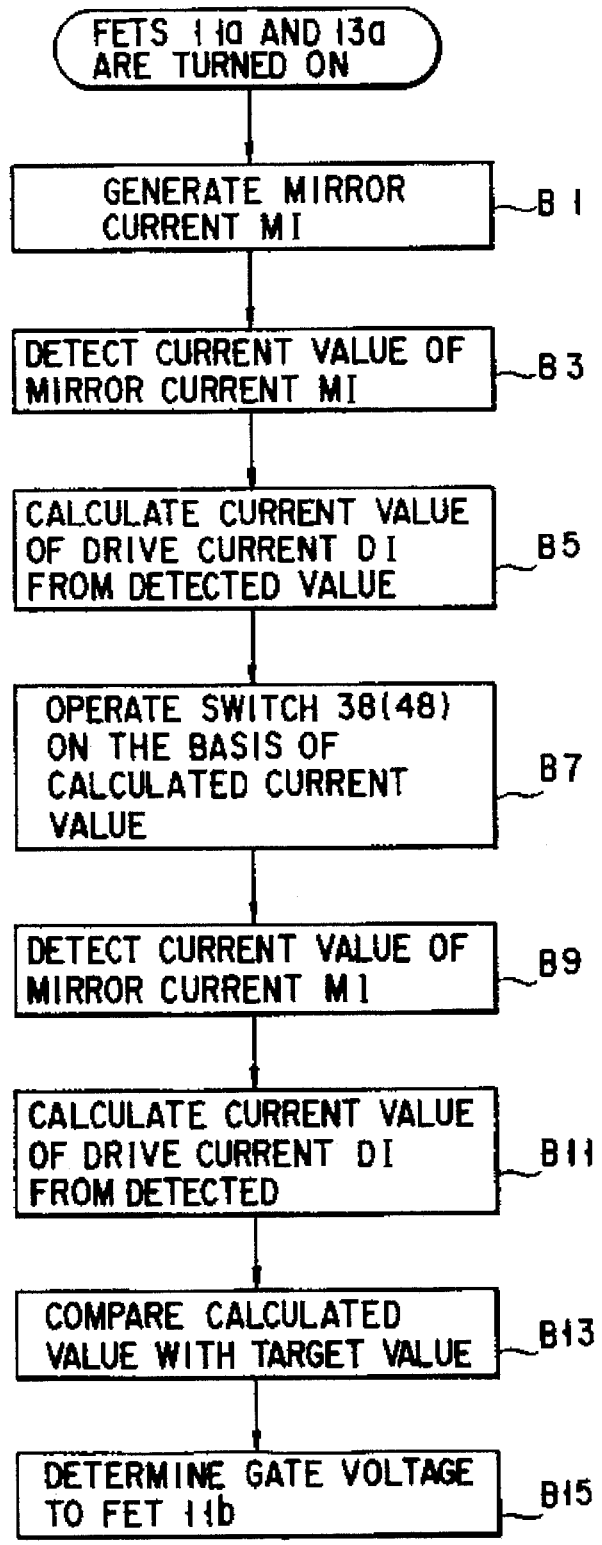
FIG. 11 is a flowchart of an operation of a modification of the third embodiment.

In this embodiment, it is supposed that the gain switch signal G is output from the control unit (not shown), but the gain switch signal G may be output from the phase switch current control circuit 37. The operation in this case will now be described with reference to FIG. 11. It is supposed, however, that the analog switch 38 is set in the turn-off state in advance.

In response to the phase switch signal PS, the FETS 31a and 33a are turned on and the drive current DI and mirror current MI begin to flow. The FET 31a generates a mirror current MI of a predetermined ratio to the current value of the drive current DI, in accordance with a predetermined cell ratio (step B1). A voltage corresponding to the current value of the mirror current MI is supplied from the current detection resistor 34 to the phase switch current control circuit 37. In the phase switch current control circuit 37, the current value of the mirror current is found on the basis of the supplied voltage (step B3). The phase switch current control circuit 37 calculates the current value of the drive current on the basis of the current value of the mirror current (step B5). Specifically, the current value of the drive current is calculated by making use of the fact that the ratio between the current value of the mirror current and that of the drive current is already known. Thereafter, on the basis of the calculated current value of the drive current, the phase switch current control circuit 37 controls the switching of the analog switch 38 so as to generate the proper mirror current (step B7).

Subsequently, the phase switch current control circuit detects the current value of the mirror current once again and calculates the current value of the drive current on the basis of the detection value (steps B9 and B11). Furthermore, the phase switch current control circuit 17 compares the target current value represented by the current control signal with the current value of the drive current, and outputs the gate voltage corresponding to the error to the FET 11b (steps B13 and B15).

First and second modifications of the third embodiment will now be described with reference to FIGS. 8B and 8C.

Figure 8B:
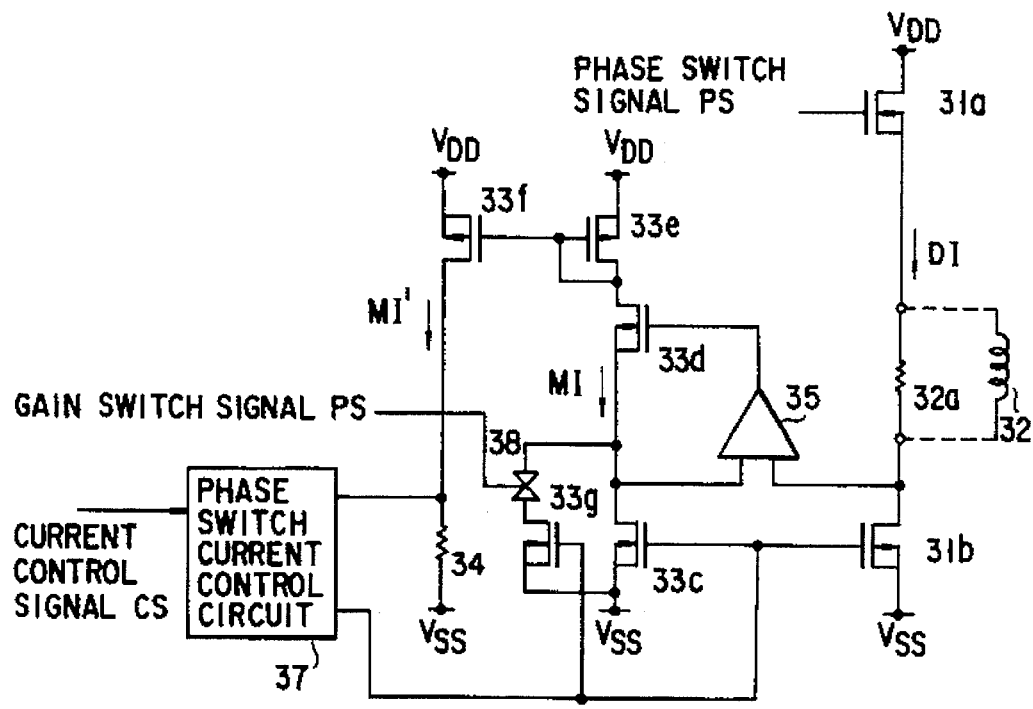

In the first modification as shown in FIG. 8B, the method of switching a gain in a mirror current generating FET in the motor control system as shown in FIG. 8A is applied to the first-stage mirror current generating FET of the motor control system as shown in FIG. 7C.

Since the circuit configuration of this first modification is basically the same as that of the motor control system as shown in FIG. 7C, a detailed description thereof is omitted. However, as described above, the mirror current ratio, i.e. the voltage gain detected by the current detection resistor 34, can be switched in the FETs 31b and 33c for generating mirror current. An FET 33g and an analog switch 38 are provided for achieving gain switching. The source of the FET 33g is connected to the source of the FET 33c. The drain of the FET 33g is connected/disconnected to/from the source of the FET 33d and the drain of the FET 33c by an analog switch 38. The analog switch 38 controls the connection/disconnection in accordance with the gain switch signal PS.

Like the FETs 31b and 33c used for generating the mirror current, the gate voltage of the FET 33b is controlled by the phase switch current control circuit 37.

With this structure, in the first modification, the cell construction ratio of the FETs which determine the mirror ratio is chosen between "FET 31b:FET 33c" and "FET 31b:(FET 33c+FET 33g)."

The operation of the first modification is the same as that of the third embodiment as shown in FIG. 8A, in both cases where the phase switch current control circuit 37 executes and does not execute the gain switching. Thus, a detailed description of the operation of the first modification is omitted.

Even when the first modification is used, the same advantage as with the motor control system as shown in FIG. 8A can be obtained.

Figure 8C:
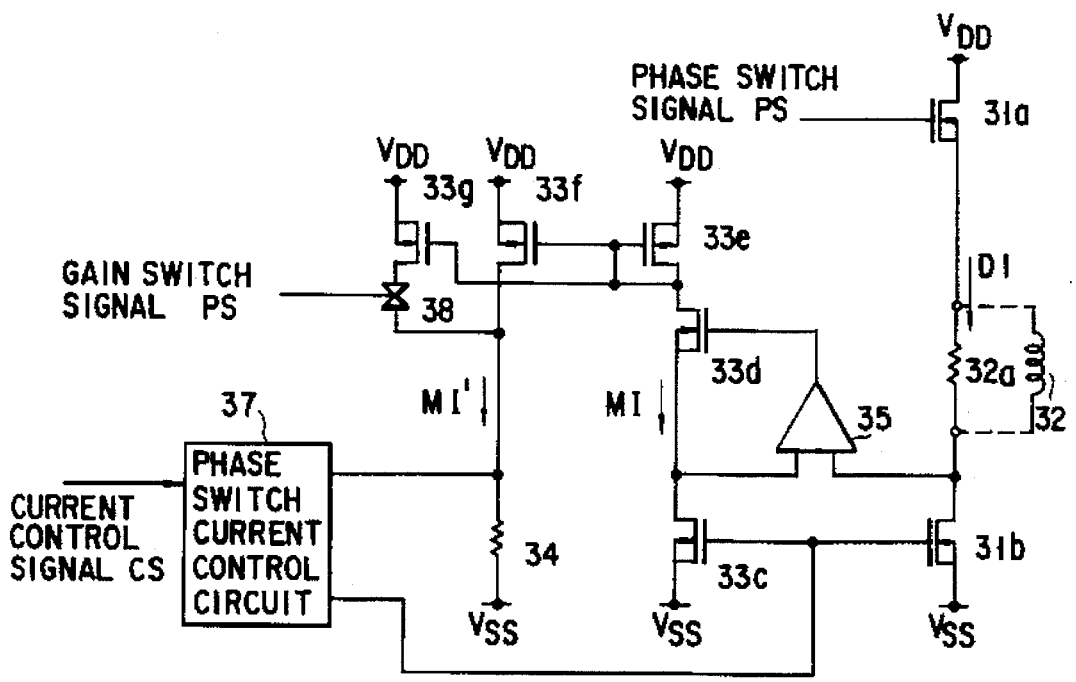

In the second modification as shown in FIG. 8C, the method of switching a gain in a mirror current generating FET in the motor control system as shown in FIG. 8A is applied to the second-stage mirror current generating FET and not to the first-stage mirror current generating FET.

Since the circuit configuration of this second modification is basically the same as that of the motor control system as shown in FIG. 7C, a detailed description thereof is omitted. However, as described above, the mirror current ratio, i.e. the voltage gain detected by the current detection resistor 34, can be switched in the FETs 33e and 33f for generating the second mirror current MI'. An FET 33g and an analog switch 38 are provided for achieving gain switching. The gate of the FET 33g is connected to the gates of the FETs 33e and 33f. The drain of the FET 33g is connected/disconnected to/from the drain of the FET 33f and the current detection resistor 34 by an analog switch 38. The analog switch 38 controls the connection/disconnection in accordance with the gain switch signal PS.

With this structure, in the second modification, the cell construction ratio of the FETs which determines the mirror ratio is chosen between "FET 33e:FET 33f" and "FET 33e:(FET 33f+FET 33g)."

The operation of the second modification is the same as that of the third embodiment as shown in FIG. 8A, in both cases where the phase switch current control circuit 37 executes and does not execute the gain switching. Thus, a detailed description of the operation of the second modification is omitted.

Even when the second modification is used, the same advantage as with the motor control system as shown in FIG. 8A can be obtained.

The motor control system according to the third embodiment including the first and second modifications can advantageously be constituted by an IC since the gain can be switched by using FETS.

A motor control system according to a fourth embodiment of the invention will now be described with reference to FIG. 9. The motor control system as shown in FIG. 9 differs from that as shown in FIG. 3A in that a series circuit of a resistor 44b and an analog switch 48 is connected in parallel between both terminals of a current detection resistor 44a.

The resistor 44b functions as a second current detection resistor. A current supplied to the object to be controlled such as a spindle motor is detected by converting it to a voltage by the current detection resistor. The conversion gain is determined by the detection resistance value. By switching the detection resistance value in accordance with the amount of current, the current control precision can be enhanced.

When the spindle motor is activated, a high-level signal is input to the analog switch 48 as a gain switch signal G, thereby turning on the analog switch 48. Thus, the detection resistance value is a composite resistance value of parallel resistors 44a and 44b. On the other hand, when the number of rotations of the spindle motor has reached a predetermined value or more, a low-level signal is input to the analog switch 48 as gain switch signal G, thereby turning off the analog switch 48. Thus, the detection resistance value is only a resistance value of the resistor 44a.

As has been described above, by switching the gain switch signal G at the time of activating the spindle motor and at the time of rotating the motor at a predetermined number of rotations or more, the current control precision can be switched between the time of activating the motor and the time of rotating the motor at a predetermined number of times or more. Since the gain is switched, different voltages are fed back to the phase switch current control circuit 47 with respect to the mirror current MI of the same value. Thus, different currents are controlled with respect to the same target current.

Thus, the current control precision is given by precision at the time of activation: precision at the time of rotation= (R1*R2)/(R1+R2):R1 The current can be controlled more precisely at the time of rotation than at the time of activation. In this embodiment, the resistance value of the resistor 44a is R1 and the resistance value of the resistor 44b is R2. For example, if R1=R2, precision at the time of activation: precision at the time of rotation=0.5:1and the precision is enhanced twice.

The operation of the fourth embodiment will now be described. Like the third embodiment, the analog switch 48 may be controlled by either a control unit (not shown) or the phase switch current control circuit 47. Accordingly, the operation of the fourth embodiment is the same as that of the third embodiment, and a detailed description thereof is omitted. The analog switch 48 is controlled (step B7) in order to optimize the voltage applied to the phase switch current control circuit 47, and not to change the current value of the mirror current.

In the present embodiment, two mirror current detection resistors are provided, and two switchable levels of current control precision are provided. However, three or more detection resistors may be provided and a plurality of levels of current control precision may be provided. Moreover, in the motor control system according to the third embodiment, it is possible to provide three FETs for outputting a mirror current and to switch among three or more levels of mirror ratios.

The embodiments of the motor control systems for the spindle motor have been described. The present invention, however, is applicable to a voice coil motor of a hard disk system. Furthermore, the circuit configuration of the current mirror circuit is not limited to the above-described embodiments, and the current mirror circuit can be realized with other circuit configurations.

In the above described embodiments, the P (positive)- channel FET and the N (negative)-channel FET can be applied selectively by modifying.

As has been described above in detail, according to the present invention, a decrease in drive current due to a current source-side voltage loss can be prevented in the current control type motor control method. In addition, a power consumption due to current detection can be reduced. Accordingly, since the motor drive current can be supplied efficiently, high-efficiency motor control can be realized, with a decrease in motor drive torque being prevented.

In particular, when the motor to be controlled is a spindle motor of a hard disk apparatus, a greater drive current can be supplied than in the prior art. Thus, an adequate drive current can be supplied to a motor, for example, until the head levitates, or even if a friction preventing agent coated on a media surface is removed, or even if the head and media are adhered to each other due to a factor such as humidity. Furthermore, the operational voltage can be decreased in accordance with the recent trend, and the memory density can be increased, for example, by increasing the number of media.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A current control system for a motor having a plurality of phase coils comprising:

a power source for generating power;

a first FET (Field Effect Transistor) having a drain connected to said power source, for supplying a drive current to one of said plurality of phase coils;

a second FET having a gate and a drain connected to gate and the drain of said first FET respectively, for generating a mirror current having a current value of a ratio to a current value of said drive current, the ratio being in accordance with a cell ratio of said second FET to said first FET;

switching means connected to the gates of said first and second FETs, for switching operation of said first and second FETs in order to select a phase coil from said phase coils, to be supplied with the drive current;

a third FET having drain connected to a source of said second FET;

an operational amplifier having input terminals connected to sources of said first and second FETs, and respectively and an output connected to a gate of said third FET;

current detection means connected in series with said second and third FETs, for detecting the current value of said mirror current;

a fourth FET connected in series with the selected phase coil; and current control means for comparing the current value of said mirror current detected by said current detection means with a desired current value, for supplying a gate voltage to a gate of said fourth FET according to a comparison result in order to control a current value of said drive current and for supplying a gate voltage to the gate of said fourth FET to switch a phase of the phase coil, wherein the selected phase coil is provided between the source of said first FET and a drain of said fourth FET.

2. The current control system according to claim 1, further comprising:

ratio control means having at least one FET, each gate of said at least one FET being connected to the gates of said first and second FETs and each drain of said at least one FET being connected to the drains of said first and second FETs, for switching connection between each source of said at least one FET and the source of said second FET in order to change said ratio to a desired ratio.

3. The current control system according to claim 1, wherein said current detection means has a plurality of detection elements and detects the current value of said mirror current using at least one of the plurality of detection elements in accordance with a desired detection sensitivity.

4. A current control system comprising:

a power source for generating power.

a first FET (Field Effect Transistor) for supplying a drive current to a desired circuit a second FET having a gate and a drain connected to gate and a drain of said first FET, respectively, for generating a mirror current having a current value of a ratio to a current value of said drive current in accordance with a cell ratio of said second FET to said first FET;

switching means connected to the gates of said first and second FETs, for switching operation of said first and second FETs;

a third FET having a drain connected to a source of said second FET;

an operational amplifier having input terminals connected to sources of said first and second FETs, respectively, and an output connected to a gate of said third FET;

current detection means connected in series with said second and third FETs, for detecting the current value of said mirror current;

a fourth FET connected in series with the desired circuit; and current control means for comparing the current value of said mirror current detected by said current detection means with a desired current value and supplying a gate voltage to a gate of said fourth FET according to a comparison result in order to control a current value of said drive current.

5. The current control system according to claim 4, further comprising:

ratio control means having at least one FET, each gate of said at least one FET being connected to the gates of said first and second FETs and each drain of said at least one FET being connected to the drains of said first and second FETs, for switching connection between each source of said at least one FET and the source of said second FET in order to change said ratio to a desired ratio.

6. The current control system according to claim 4, wherein said current detection means has a plurality of detection elements and detects the current value of said mirror current using at least one of the current detection elements in accordance with a desired detection sensitivity.

7. A current control method, for use in a motor control system having a motor with a plurality of phase coils, having a power source for generating power, a first FET (Field Effect Transistor) having a drain connected to said power source, a second FET having a gate and a drain connected to a gate and the drain of said first FET, respectively, a third FET having a drain connected to a source of said second FET, an operational amplifier having input terminals connected to sources of said first and second FETs, respectively, and an output connected to a gate of said third FET, and a fourth FET connected in series with a target phase coil of the plurality of said phase coils, the target phase coil being provided between the source of said first FET and a drain of said fourth FET, said method comprising the steps of:

supplying a drive current to one of said phase coils, from the source of said first FET;

generating a mirror current having a current value of a ratio to the current value of said drive current, with use of said first and second FETs, the ratio being in accordance with a cell ratio of said second FET to said first FET;

switching operation of said first and second FETs in order to select a phase coil as the target coil to be supplied with the drive current, from said plurality of said coils;

detecting the current value of the mirror current;

comparing the detected current value of said mirror current with a desired current value;

supplying a gate voltage to a gate of said fourth FET according to a comparison result in order to control a current value of said drive current: and supplying a gate voltage to the gate of said fourth FET to switch a phase of the phase coil.

8. The current control method according to claim 7, wherein said motor control system includes at least one FET, each gate of said at least one FET being connected to the gates of said first and second FETs and each drain of said at least one FET being connected to the drains of said first and second FETs, and said method further comprising the step of:

switching connection between each source of said at least one FET and the source of said second FET in order to changes said ratio to a desired ratio.

9. The current control method according to claim 7, wherein said motor control system has a plurality of detection elements, and said detecting step includes a step of selecting at least one of the plurality of detection elements in accordance with a desired detection sensitivity so that the current value of the mirror current is detected in accordance with the selected detection sensitivity.

10. A current control method for use in a current control system for effecting current control of a desired circuit, said current control system having a power source for generating power, a first FET (Field Effect Transistor), a second FET having a gate and a drain connected to a gate and a drain of said first FET, respectively, a third FET having a drain connected to a source of said second FET, an amplifier having input terminals connected to sources of said first and second FETs respectively, and an output connected to a gate of said third FET, and a fourth FET connected in series with the desired circuit, said method comprising the steps of:

supplying a drive current to said desired circuit from the source of said first FET;

generating a mirror current having a current value of a ratio to a current value of said drive current, with use of said first and second FETs, the ratio being in accordance with a cell ratio of said second FET to said first FET;

switching operation of said first and second FETs;

detecting the current value of the mirror current;

comparing the detected current value of said mirror current with a desired current value; and supplying a gate voltage to a gate of said fourth FET according to a comparison result in order to control a current value of said drive current.

11. The current control method according to claim 10, wherein said current control system includes at least one FET, each gate of said at least one FET being connected to the gates of said first and second FETs and each drain of said at least one FET being connected to the drains of said first and second FETs, said method further comprising the step of:
switching connection between each source of said at least one FET and the source of said second FET in order to change the ratio to a desired ratio.

12. The current control method according to claim 10, wherein said current control system has a plurality of detection elements, and said detecting step includes a step of selecting at least one of the plurality of detection elements in accordance with a desired detection sensitivity so that the current value of the mirror current is detected in accordance with the selected detection sensitivity.

13. A current control system for a motor having a plurality of phase coils, comprising:

a power source for generating power;

a first FET (Field Effect Transistor) having a drain connected to said power source, for supplying a drive current to one of said plurality of said phase coils;

a second FET having a gate and a drain connected to a gate and the drain of said first FET, respectively, for generating a mirror current having a current value of a ratio to a current value of said drive current, the ratio being in accordance with a cell ration of said second FET to said first FET;

a third FET having a drain connected to a source of said second FET;

an operational amplifier having input terminals connected to sources of said first and second FETs, respectively, and an output connected to a gate of said third FET;

current detection means connected in series with said second and third FETs, for detecting the current value of said mirror current;

a fourth FET connected in series with the selected phase coil;

switching means connected to the gate of said fourth FET, for switching operation of said fourth FET in order to select a phase coil from said phase coils, to be supplied with the drive current; and current control means for comparing the current value of said mirror current detected by said current detection means with a desired current value, for supplying a gate voltage to gates of said first and second FETs according to a comparison result in order to control a current value of said drive current and for supplying a gate voltage to the gates of said first and second FETs to switch a phase of the phase coil, wherein the selected phase coil is provided between the source of said first FET and a drain of said fourth FET.

14. The current control system according to claim 13, further comprising:

ratio control means having at least one FET, each gate of said at least one FET being connected to the gates of said first and second FETs and each drain of said at least one FET being connected to the drain of said first and second FETs, for switching connection between each source of said at least one FET and the source of said second FET in order to change the ratio to a desired ratio.

15. The current control system according to claim 13, wherein said current detection means has a plurality of detection elements and detects the current value of said mirror current using at least one of the plurality of detection elements in accordance with a desired detection sensitivity.

16. A current control system for a motor having a plurality of phase coils, comprising:

a power source for generating power;

a first FET (Field Effect Transistor) having a drain connected to said power source, for supplying a drive current to one of said phase coils;

a second FET having a gate and a drain connected to a gate and the drain of said first FET, respectively, for generating a first mirror current having a current value of a first ratio to a current value of said drive current, the first ratio being in accordance with a cell ratio of said second FET to said first FET;

a third FET having a drain connected to a source of said second FET;

an operational amplifier having input terminals connected to sources of said first and second FETs, respectively, and an output connected to a gate of said third FET;

a fourth FET connected in series with the one phase coil;

a fifth FET having a drain connected to a source of said third FET;

a sixth FET having a gate connected to the drain and a gate of said fifth FET, for generating a second mirror current having a current value of a second ratio to a current value of said first mirror current, the second ratio being in accordance with a cell ratio of said sixth FET to said fifth FET;

current detection means for detecting the current value of said second mirror current;

switching means connected to the gate of said fourth FET, for switching operation of said fourth FET in order to select a phase coil from said phase coils, to be supplied with the drive current; and current control means for comparing the current value of said second mirror current detected by said current detection means with a desired current value, for supplying a gate voltage to gates of said first and second FETs according to a comparison result in order to control a current value of said drive current and for supplying a gate voltage to the gates of said first and second FETs to switch a phase of the phase coil, wherein the one phase coil is provided between the source of said first FET and a drain of said fourth FET.

17. The current control system according to claim 16, further comprising:

ratio control means having at least one FET, each gate of said at least one FET being connected to the gates of said first and second FETs and each drain of said at least one FET being connected to the drains of said first and second FETs, for switching connection between each source of said at least one FET and the source of said second FET in order to change the first ratio to a desired ratio.

18. The current control system according to claim 16, further comprising:

ratio control means having at least one FET, each gate of said at least one FET being connected to the gates of said fifth and sixth FETs and each drain of said at least one FET being connected to the drains of said fifth and sixth FETs, for switching connection between each source of said at least one FET and the source of said sixth FET in order to change the second ratio to a desired ratio.

19. The current control system according to claim 16, wherein said current detection means has a plurality of detection elements and detects the current value of said second mirror current using at least one of the plurality of detection elements in accordance with a desired detection sensitivity.

20. A current control system comprising:

a power source for generating power;

a first FET (Field Effect Transistor) having a drain connected to said power source, for supplying a drive current to a desired circuit;

a second FET having a gate and a drain connected to a gate and the drain of said first FET, respectively, for generating a first mirror current having a current value of a ratio to a current value of said drive current, the ratio being in accordance with a cell ratio of said second FET to said first FET;

a third FET having a drain connected to a source of said second FET;

an operational amplifier having input terminals connected to sources of said first and second FETs, respectively, and an output connected to a gate of said third FET;

current detection means connected in series with said second and third FETs, for detecting the current value of said mirror current;

a fourth FET connected in series with the desired circuit;

switching means connected to the gate of said fourth FET, for switching operation of said fourth FET; and current control means for comparing the current value of said mirror current detected by said current detection means with a desired current value, for supplying a gate voltage to gates of said first and second FETs according to a comparison result in order to control a current value of said drive current.

21. The current control system according to claim 20, further comprising:

ratio control means having at least one FET, each gate of said at least one FET being connected to the gates of said first and second FETs and each drain of said at least one FET being connected to the drains of said first and second FETs, for switching connection between each source of said at least one FET and the source of said second FET in order to change the ratio to a desired ratio.

22. The current control system according to claim 20, wherein said current detection means has a plurality of detection elements and detects the current value of said mirror current using at least one of the plurality of detection elements in accordance with a desired detection sensitivity.

23. A current control system comprising:

a power source for generating power;

a first FET (Field Effect Transistor) having a drain connected to said power source, for supplying a drive current to a desired circuit;

a second FET having a gate and a drain connected to a gate and the drain of said first FET, respectively, for generating a first mirror current having a current value of a first ratio to a current value of said drive current, the first ratio being in accordance with a cell ratio of said second FET to said first FET;

a third FET having a drain connected to a source of said second FET;

an operational amplifier having input terminals connected to sources of said first and second FETs respectively, and an output connected to a gate of said third FET;

a fourth FET connected in series with the desired circuits.

a fifth FET having a drain connected to a source of said third FET;

a sixth FET having a gate connected to the drain and a gate of said fifth FET, for generating a second mirror current having a current value of a second ratio to the current value of said first mirror current, the second ratio being in accordance with a cell ratio of said sixth FET to said fifth FET;

current detection means for detecting the current value of said second mirror current;

switching means connected to the gate of said fourth FET, for switching operation of said fourth FET; and current control means for comparing the current value of said second mirror current detected by said current detection means with a desired current value, for supplying a gate voltage to gates of said first and second FETs according to a comparison result in order to control a current value of said drive current.

24. The current control system according to claim 23, further comprising:

ratio control means having at least one FET, each gate of said at least one FET being connected to the gates of said first and second FETs and each drain of said at least one FET being connected to the drains of said first and second FETs for switching connection between each source of said at least one FET and the source of said second FET in order to change the first ratio to a desired ratio.

25. The current control system according to claim 23, further comprising:

ratio control means having at least one FET, each gate of said at least one FET being connected to the gates of said fifth and sixth FETs and each drain of said at least one FET being connected to the drains of said first and second FETs, for switching connection between each source of said one or more FETs and the source of said sixth FET in order to change the second ratio to a desired ratio.

26. The current control system according to claim 23, wherein said current detection means has a plurality of detection elements and detects the current value of said second mirror current using at least one of the plurality of detection elements in accordance with a desired detection sensitivity.

27. A current control method for use in a motor control system for a motor having a plurality of phase coils, having a power source for generating power, a first FET (Field Effect Transistor) having a drain connected to said power source, a second FET having a gate and a drain connected to a gate and the drain of said first FET, respectively, a third FET having a drain connected to a source of said second FET, an operational amplifier having input terminals connected to sources of said first and second FETs, respectively, and an output voltage connected to a gate of said third FET, and a fourth FET connected in series with a target phase coil, the target phase coil being provided between the source of said first FET and a drain of said fourth FET, said method comprising the steps of:

supplying a drive current to one of said plurality of said phase coils, from the source of said first FET;

generating a mirror current having a current value of a ratio to a current value of the drive current, with use of said first and second FETs the ratio being in accordance with a cell ratio of said second FET to said first FET;

switching operation of said fourth FET in order to select a phase coil from said plurality of phase coils, to be supplied with the drive current;

detecting the current value of said mirror current;

comparing the current value of said mirror current with a desired current value;

supplying a gate voltage to gates of said first and second FETs according to a comparison result of in order to control a current value of said drive current; and supplying a gate voltage to the gates of said first and second FETs to switch a phase of the phase coil.

28. The current control method according to claim 27, wherein said motor control system includes at least one FET, each gate of said at least one FET being connected to the gates of said first and second FETs and each drain of said at least one FET being connected to the drains of said first and second FETs, said method further comprising the step of:

switching connection between each source of said at least one FET and the source of said second FET in order to change the ratio to a desired ratio.

29. The current control method according to claim 27, wherein said motor control system includes a plurality of detection elements, and said detecting step includes a step of selecting at least one of the detection elements in accordance with a desired detection sensitivity, so that the current value of the mirror current is detected in accordance with the selected detection sensitivity.

30. A current control method for use in a motor control system with a motor having a plurality of phase coils, having a power source for generating power, a first FET (Field Effect Transistor) having a drain connected to said power source, a second FET having a gate and a drain connected to a gate and the drain of said first FET respectively, a third FET having a drain connected to a source of said second FET, an operational amplifier having input terminals connected to sources of said first and second FETs respectively, and an output connected to a gate of said third FET, a fourth FET connected in series with a target phase coil, a fifth FET having a drain connected to a source of said third FET, and a sixth FET having a gate connected to the drain and a gate of said fifth FET, the target phase coil being provided between the source of said first FET and a drain of said fourth FET, said method comprising the steps of:

supplying a drive current to one of said phase coils, from the source of said first FET;

generating a first mirror current having a current value of a first ratio to a current value of the drive current, with use of said first and second FETs, the first ratio being in accordance with a cell ratio of said second FET to said first FET;

generating a second mirror current having a current value of a second ratio to the current value of the first mirror current, with use of said fifth and sixth FETs, the second ratio being in accordance with a cell ratio of said sixth FET to said fifth FET;

detecting the current value of said second mirror current;

switching operation of said fourth FET in order to select a phase coil from said phase coils, to be supplied with the drive current;

comparing the current value of said second mirror current with a desired current value;

supplying a gate voltage to gates of said first and second FETs according to a comparison result in order to control a current value of said drive current; and supplying a gate voltage to a gate of said fourth FET to switch a phase of the plurality of phase coils.

31. The current control method according to claim 30, wherein said motor control system includes at least one FET, each gate of said at least one FET being connected to the gates of said first and second FETs and each drain of said at least one FET being connected to the drains of said first and second FETs, said method further comprising the step of:

switching connection between each source of said at least one FET and the source of said second FET in order to change the first ratio to a desired ratio.

32. The current control method according to claim 30, wherein said motor control system includes at least one FET, each gate of said at least one FET being connected to the gates of said fifth and sixth FETs and each drain of said at least one FET being connected to the drains of said fifth and sixth FETs, said method further comprising the step of:

switching connection between each source of said at least one FET and the source of said sixth FET in order to change the second ratio to a desired ratio.

33. The current control method according to claim 30, wherein said motor control system includes a plurality of detection elements, and said detecting step includes a step of selecting at least one of the detection elements in accordance with a desired detection sensitivity, so that the current value of the mirror current is detected accordance with the selected detection sensitivity.

34. A current control method for use in a current control system for effecting current control of a desired circuit, said current control system having a power source for generating power, a first FET (Field Effect Transistor) having a drain connected to said power source, a second FET having a gate and a drain connected to a gate and the drain of said first FET respectively, a third FET having a drain connected to a source of said second FET, an operational amplifier having input terminals connected to sources of said first and second FETs, respectively, and an output connected to a gate of said third FET, and a fourth FET connected in series with the desired circuit, said method comprising the steps of:

supplying a drive current to said desired circuit from the source of said first FET;

generating a mirror current having a current value of a ratio to a current value of the drive current, with use of said first and second FETs, the ratio being in accordance with a cell ratio of said second FET to said first FET;

switching operation of said fourth FET;

detecting the current value of said mirror current;

comparing the current value of said mirror current with a desired current value; and supplying a gate voltage to gates of said first and second FETs according to a comparison result of in order to control a current value of said drive current.

35. The current control method according to claim 34, wherein said current control system includes at least one FET, each gate of said at least one FET being connected to the gates of said first and second FETs and each drain of said at least one FET being connected to the drains of said first and second FETs, said method further comprising the step of:

switching connection between each source of said at least one FET and the source of said second FET in order to change the ratio to a desired ratio.

36. The current control method according to claim 34, wherein said current control system includes a plurality of detection elements, and said detecting step includes the step of selecting at least one of the detection elements in accordance with a desired detection sensitivity so that the current value of the mirror current is detected in accordance with the selected detection sensitivity.

37. A current control method for use in a current control system for effecting current control of a desired circuit, said current control system having a power source for generating power, a first FET (Field Effect Transistor) having a drain connected to said power source, a second FET having a gate and a drain connected to a gate and the drain of said first FET, respectively, a third FET having a drain connected to a source of said second FET, an operational amplifier having input terminals connected to sources of said first and second FETs, respectively, and an output connected to a gate of said third FET, a fourth FET connected in series with the desired circuit, a fifth FET having a drain connected to a source of said third FET, and a sixth FET having a gate connected to the drain and a gate of said fifth FET, said method comprising the steps of:

supplying a drive current to said desired circuit, from the source of said first FET;

generating a first mirror current having a current value of a first ratio to a current value of the drive current, with use of said first and second FETs, the first ratio being in accordance with a cell ratio of said second FET to said first FET;

generating a second mirror current having a current value of a second ratio to the current value of the first mirror current, with use of said fifth and sixth FETs, the second ratio being in accordance with a cell ratio of said sixth FET to said fifth FET;

detecting the current value of said second mirror current;

switching operation of said fourth FET;

comparing the current value of said second mirror current with a desired current value; and supplying a gate voltage to gates of said first and second FETs according to a comparison result in order to control a current value of said drive current.

38. The current control method according to claim 37, wherein said current control system includes at least one FET, each gate of said at least one FET being connected to the gates of said first and second FETs and each drain of said at least one FET being connected to the drains of said first and second FETs, said method further comprising the step of:

switching connection between each source of said at least one FET and the source of said second FET in order to change the first ratio to a desired ratio.

39. The current control method according to claim 37, wherein said current control system includes at least one FET, each gate of said at least one FET being connected to the gates of said fifth and sixth FETs and each drain of said at least one FET being connected to the drains of said fifth and sixth FETs, said method further comprising the step of:

switching connection between each source of said at least one FET and the source of said sixth FET in order to change the second ratio to a desired ratio.

40. The current control method according to claim 37, wherein said current control system includes a plurality of detection elements, and said detecting step includes a step of selecting at least one of the detection elements in accordance with a desired detection sensitivity, so that the current value of the mirror current is detected in accordance with the selected detection sensitivity.

* * * * *